(12) United States Patent
Usami

(10) Patent No.: US 7,612,453 B2
(45) Date of Patent: Nov. 3, 2009

(54) SEMICONDUCTOR DEVICE HAVING AN INTERCONNECT STRUCTURE AND A REINFORCING INSULATING FILM

(75) Inventor: Tatsuya Usami, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 101 days.

(21) Appl. No.: 11/359,440

(22) Filed: Feb. 23, 2006

(65) Prior Publication Data

US 2007/0052101 A1 Mar. 8, 2007

(30) Foreign Application Priority Data

Mar. 11, 2005 (JP) ............................. 2005-069874

(51) Int. Cl.
*H01L 23/48* (2006.01)
(52) U.S. Cl. ...................... 257/758; 257/508; 257/522; 257/635; 257/637; 257/750; 257/751; 257/759; 257/760; 257/E21.575; 257/E23.145
(58) Field of Classification Search ................. 257/508, 257/522, 635, 637, 750, 751, 758–760, E21.575, 257/E23.145
See application file for complete search history.

(56) References Cited

U.S. PATENT DOCUMENTS

| | | | |
|---|---|---|---|
| 5,494,859 A * | 2/1996 | Kapoor | 438/477 |
| 6,274,476 B1 | 8/2001 | Oda et al. | |
| 6,413,852 B1 | 7/2002 | Grill et al. | |
| 6,500,752 B2 * | 12/2002 | Oku et al. | 438/622 |
| 6,531,776 B2 * | 3/2003 | Lin et al. | 257/751 |
| 6,670,710 B2 * | 12/2003 | Matsunaga | 257/758 |
| 2004/0089924 A1 | 5/2004 | Yuasa et al. | |
| 2004/0157436 A1 * | 8/2004 | Wong | 438/672 |
| 2005/0167844 A1 * | 8/2005 | Ohto et al. | 257/758 |

FOREIGN PATENT DOCUMENTS

| | | |
|---|---|---|
| CN | 1231504 | 10/1999 |
| CN | 1336686 | 2/2002 |
| CN | 1492504 | 4/2004 |

OTHER PUBLICATIONS

S. Nitta et al. (2004.12) "Successful Dual Damascene Integration of Extreme Low k Materials (k<2.0) Using a Novel Gap Fill Based Integration Scheme", IEDM 2004 Proceedings, IEEE, U.S.
Chinese First Office Action, Jul. 20, 2007.

* cited by examiner

*Primary Examiner*—Andy Huynh
(74) *Attorney, Agent, or Firm*—Young & Thompson

(57) ABSTRACT

A semiconductor device includes in an interconnect structure which includes a first interconnect made of a copper-containing metal, a first Cu silicide layer covering the upper portion of the first interconnect, a conductive first plug provided on the upper portion of the Cu silicide layer and connected to the first interconnect, a Cu silicide layer covering the upper portion of the first plug, a first porous MSQ film provided over the side wall from the first interconnect through the first plug and formed to cover the side wall of the first interconnect, the upper portion of the first interconnect, and the side wall of the first plug, and a first SiCN film disposed under the first porous MSQ film to contact with the lower portion of the side wall of the first interconnect and having the greater film density than the first porous MSQ film.

21 Claims, 16 Drawing Sheets

SEMICONDUCTOR DEVICE HAVING AN INTERCONNECT STRUCTURE AND A REINFORCING INSULATING FILM

This application is based on Japanese patent application NO. 2005-069874, the content of which is incorporated hereinto by reference.

BACKGROUND

1. Technical Field

The present invention relates to a semiconductor device with multilayer interconnect structure and to a manufacturing method thereof.

2. Related Art

With finer design adopted in semiconductor device, significant signal delay in metal interconnects has been observed and further improvement thereof is required. To countermeasure this delay, low dielectric constant film (Low-k film) is used as an insulating interlayer. The followings are configurations of conventional interconnects and via using Low-k film as an insulating interlayer.

FIG. 14 is a cross sectional view showing a configuration of a conventional semiconductor device. The semiconductor device 200 shown in FIG. 14 is manufactured by using the following process.

Firstly, an $SiO_2$ film 201 and a barrier dielectric film 203 are formed on silicon substrate (not shown). The barrier dielectric film 203 is, for example, an SiC film or an SiCN film. On the barrier dielectric film 203, a porous SiOC film is formed in a film thickness of the order of 70 to 200 nm as a first Low-k film 205. On the first Low-k film 205, a hard mask $SiO_2$ film (not shown) of approximately 50 to 150 nm is formed. Then, etching and ashing are performed through photolithography process using a fluorocarbon based gas for the hard mask $SiO_2$ film and the porous SiOC film which is the first Low-k film 205 in order to form an interconnect trench. In the interconnect trench, a barrier metal film 211 and a copper interconnect 213 are formed, and then the SiCN or SiC film are formed as a barrier dielectric film 207. A porous SiOC film is formed thereon as a second Low-k film 209 and is similarly processed to form a via hole 215. This is how the semiconductor device 200 shown in FIG. 14 is configured. Afterward, a metal films is buried in the via hole 215 to form a via plug (not shown) The process is repeated to form a multilayered interconnect.

S. Nitta et al. (December 2004) "Successful Dual Damascene Integration of Extreme Low k Materials (k<2.0) Using a Novel Gap Fill Based Integration Scheme", IEDM 2004 Proceedings, IEEE, U.S., and U.S. Pat. No. 6,413,852 disclose a configuration in which copper interconnects are formed firstly in porous Low-k film, another porous Low-k film is formed thereupon, and via is formed in the Low-k film. According to a technique described in these documents, a porous Low-k film is used as insulating film to lower the dielectric constant.

SUMMARY OF THE INVENTION

The inventor of the present invention investigated the technique described in the above documents and found room for improvement in terms of the following points.

In the semiconductor device 200 described with reference to FIG. 14, the hard mask $SiO_2$ film (not shown) and the porous SiOC film were removed through photolithography process, specifically, a fluorocarbon based gas was used for etching and ashing. With this process, in an exposed region of the first Low-k film 205 and second Low-k film 209 is formed a damaged layer 217. In the region where the damaged layer 217 was formed, Si—$CH_3$ bonding of the Low-k film was broken to increase dielectric constant of the Low-k film.

In addition, peeling may occur in a stacked portion where on a layer in which the copper interconnect 213 is to be formed, that is, an interconnect layer, a layer with via plug (via) and a smaller metal area than the interconnect layer is formed. Specifically, adhesiveness is poor between the porous SiOC film as the second Low-k film 209 and the SiCN or SiC film as the barrier dielectric film 207. Therefore, during a T/C (thermal cycle) test after forming a multilayer interconnect and assembling, the films may be peeled due to a difference in a thermal expansion coefficient between the films, leading to a peeled interface 219.

In order to reduce peeling at the interface, a configuration can be suggested in which no barrier dielectric film 207 is provided at the interface between the first Low-k film 205 and the second Low-k film 209. FIG. 15 is a cross sectional view showing a configuration of a such semiconductor device. In the semiconductor device 210 shown in FIG. 15 in which no barrier dielectric film 207 is provided, an etching stopper is required during formation of via hole, and therefore a cap metal film 221 is provided at the upper portion of the copper interconnect 213.

Finer interconnect and smaller via diameter, however, may cause misalignment during formation of via, while for larger diameter of wafer may cause misalignment between the interconnect and the via in a part of regions. In the semiconductor device 210 shown in FIG. 15, porous SiOC films are stacked as the first Low-k film 205 and second Low-k film 209 so as to constitute interconnect layers, and unlanded via 226 is formed due to a misalignment that occurs during formation of via hole in the second Low-k film 209. In this configuration, because the Low-k film that is an object of the process is a porous material, etching speed may be faster, and the via may 'step off' the interconnect and be provided inappropriately once misalignment occurs to a via hole in which an unlanded via 226 will be formed. Specifically, etching advances rapidly in a depth direction to as deep as the region of first Low-k film 205 once misalignment occurs, while via hole is stopped at the upper portion of the copper interconnect 213 when no misalignment occurs. There was a concern that there may be a burial failure during burial process of a barrier metal film or a copper film into the via hole.

In U.S. Pat. No. 6,413,852 described in the Related Art, the interconnect structure is manufactured through dual damascene process; however, there was a problem that a configuration of interconnect and connection plug with copper through dual damascene process reduces yields of semiconductor device, leading to unstable production. There still is room for further improvement to achieve a long-term stable use of semiconductor device and to attain greater reliability of elements in semiconductor device.

The following configurations show the case in which the technique described in U.S. Pat. No. 6,413,852 is applied to single damascene process. FIGS. 16A and 16B are cross sectional view showing a manufacturing process of semiconductor device in which the technique described in U.S. Pat. No. 6,413,852 is applied to the single damascene process.

As shown in FIG. 16A, a $SiO_2$ film 201 and a barrier dielectric film 203 are formed on a silicon substrate (not shown). On the barrier dielectric film 203, a first Low-k film 205 and a hard mask $SiO_2$ film (not shown) are formed. Subsequently, etching using fluorocarbon based gas and ashing are performed for the hard mask $SiO_2$ film and the first Low-k film 205 through a photolithography process in order to form an interconnect trench. In the interconnect trench, a barrier metal film 211 and a copper interconnect 213 are formed, and on the copper interconnect 213, a Cu silicide layer is selectively formed (as shown in FIG. 16A) as a cap metal film 221.

Then, as shown in FIG. 16B, the first Low-k film 205 and the barrier dielectric film 203 are removed in this order and the copper interconnect 213 is exposed.

With this configuration, however, during a step of removing the barrier dielectric film 203 that functions as a stopper of the copper interconnect 213 through etching, the interconnect may be lifted off because it is difficult to control the etching conditions. This is partly because an etchant flows into the interface between the copper interconnect 213 and underlying layer ($SiO_2$ film 201) and pushes up the copper interconnect 213 as shown in FIG. 16B.

As described above, low dielectric constant film (Low-k film) has been gradually adopted as an insulating interlayer, however, in the single damascene process, further Low-k of insulating interlayer causes damage of Low-k film during the process of Low-k film, and thus there was a concern that the lowering of dielectric constant may be practically difficult. The adoption of Low-k film has reduced mechanical strength in insulating interlayer, particularly, at an interface of the interlayer film with via therein that have less data ratio, and occurrence of peeling-off has thus been observed significantly. There also is a fear that the finer interconnect structure causes misalignment between the interconnect and the via, and creates a gap between the interconnect and Low-k film.

According to the present invention, there is provided a semiconductor device having an interconnect structure, comprising:

a first interconnect made of a copper-containing metal;

a first cap metal film provided to contact an upper portion of the first interconnect and covering the upper portion of the first interconnect;

a conductive via provided on the upper portion of the first cap metal film and connected to the first interconnect;

an insulating film provided from a side wall of the first interconnect to a side wall of the via and formed so as to cover the side wall of the first interconnect, the upper portion of the first interconnect, and the side wall of the via; and a reinforcing insulating film disposed under the insulating film and contact with a lower portion of the side wall of the first interconnect and has greater film density than the insulating film.

In this configuration, at the boundary between a first interconnect-formed layer that is the lower layer and a via-formed layer that is the upper layer, the data ratio changes significantly and discontinuously. Providing films that are made of different materials in the aforementioned boundary region causes a peeling of films at the interface therebetween. In contrast, according to the present invention, the upper portion of the first interconnect is provided with a first cap metal film, and an insulating film is provided from the side wall of the first interconnect through the side wall of the via in such a way that the insulating film covers the side wall of the first interconnect, the upper portion of the first interconnect, and side wall of via. With such configuration in which no films that are made of different materials are provided at the boundary between the first interconnect-formed layer and the via-formed layer, peeling of insulating film at the boundary between the first interconnect-formed layer and the via-formed layer can thus be suppressed. Since no films that are made of different materials are, the dielectric constant of insulating film can be effectively reduced.

The term "data ratio" used in the present specification refers to a ratio of area that shows occupation ratio of metal film in the insulating layer. In general, layers in which interconnects are formed have higher data ratios while layers in which vias are formed have lower data ratios. The data ratios between these layers differ significantly with each other.

First cap metal film is provided at the upper portion of the first interconnect, so that via can be formed in a stable manner even films are not made of different materials as described above. In addition, the insulating film is formed so as to cover the side wall of the first interconnect, the upper portion of the first interconnect, and side wall of the via. This configuration can prevent burial failures in the via and can suppress the reduction in yield during manufacturing process even when misalignment occurs at the via that is provided on the first cap metal film.

Additionally, with this configuration in which a reinforcing insulating film that has higher film density than the insulating film is provided at the lower portion of the side wall of the first interconnect, the first insulating film can be reinforced in order to protect the bottom surface and at the same time the first interconnect is supported in the reinforcing insulating film and can reduce peeling of the first interconnect at its bottom surface during manufacturing process.

According to the semiconductor device of the present invention, the configuration makes it possible to effectively reduce the dielectric constant of insulating film and to achieve stable production.

In the present invention, the configuration may be such that the insulating film is formed contiguously and integrally from the side wall of the first interconnect through the side wall of the via. The term "contiguously and integrally" used in the present invention refers to an integral formation as a continuous member. It is also preferable to be made of single material and has no connections. When a plurality of films is stacked to configure a insulating film, there is a concern that the peeling may occur at an interface between films because the interface exists therebetseen; however, the configuration according to the present invention has no interface so that the thermal cycle properties can further be improved and the dielectric constant of insulating film can be more effectively reduced.

According to the present invention, there is provided a method for manufacturing a semiconductor device, comprising:

forming a first reinforcing insulating film and a first sacrificial interlayer film in this order;

forming a first trench from the first sacrificial interlayer film through the first reinforcing insulating film, then in the first trench, forming a first interconnect made of a copper-containing metal, and forming a first cap metal film covering the upper portion of the first interconnect;

forming a sacrificial barrier dielectric film and a second sacrificial interlayer film on the upper portion of the first cap metal film in this order;

selectively removing the second sacrificial interlayer film and the sacrificial barrier dielectric film sequentially in order to form a hole with the first cap metal film exposed at the bottom of the hole, forming a conductive via connected to the first interconnect by forming a conductive film in the hole, and forming a second cap metal film covering the via at the upper portion of the via;

exposing the first interconnect and the via by selectively removing the second sacrificial interlayer film, the sacrificial barrier dielectric film, and the first sacrificial interlayer film sequentially after the forming the second cap metal film; and forming an insulating film covering the side wall of the first interconnect, the upper portion of the first interconnect, the side wall of the via which is connected to the first interconnect from the side wall of the first interconnect through the side wall of the via.

According to the present invention, the first sacrificial interlayer film, the sacrificial barrier dielectric film, and the second sacrificial interlayer film are removed to expose the first interconnect and the via, and then the insulating film is formed from the side wall of the first insulating film through the side wall of the via. This configuration eliminates a process in which, after formation of insulating film, the insulating film is selectively removed in order to form trenches or holes, reducing degradation of the insulating film caused by the process. The process for removing such sacrificial film is performed with the first interconnect held by the first reinforcing insulating film, reducing peeling of the first interconnect during the removal process of the sacrificial film.

The manufacturing process also includes a process of forming the first cap metal on the upper portion of the first interconnect and forming the sacrificial barrier dielectric film on the upper portion of the first cap metal. With this configuration, even when misalignment occurs between the underlying first interconnect and via hole during formation of via hole on the upper portion of the first interconnect, the via hole is controlled not to be formed excessively deep into the side of the first interconnect. This also controls burial failures of via in the subsequent process and thus controls reduction in yields associated therewith.

The present invention may manufacture the semiconductor device that effectively reduces the dielectric constant of the insulating film in a stable manner and may increase the yield in manufacturing process.

As described above, the semiconductor device according to the present invention may achieve low dielectric constant of the insulation layer in the interconnect structure of the semiconductor device, and may also achieve stable production.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

There will be described some embodiments of this invention with reference to the drawings, for production of a semiconductor device having a multilayer interconnect structure made of a copper-containing metal in low dielectric constant film by a single damascene process. In all the drawings, a common element is indicated by the same symbol and a common description will not be represented in the following description, appropriately.

First Embodiment

Figure 10A:
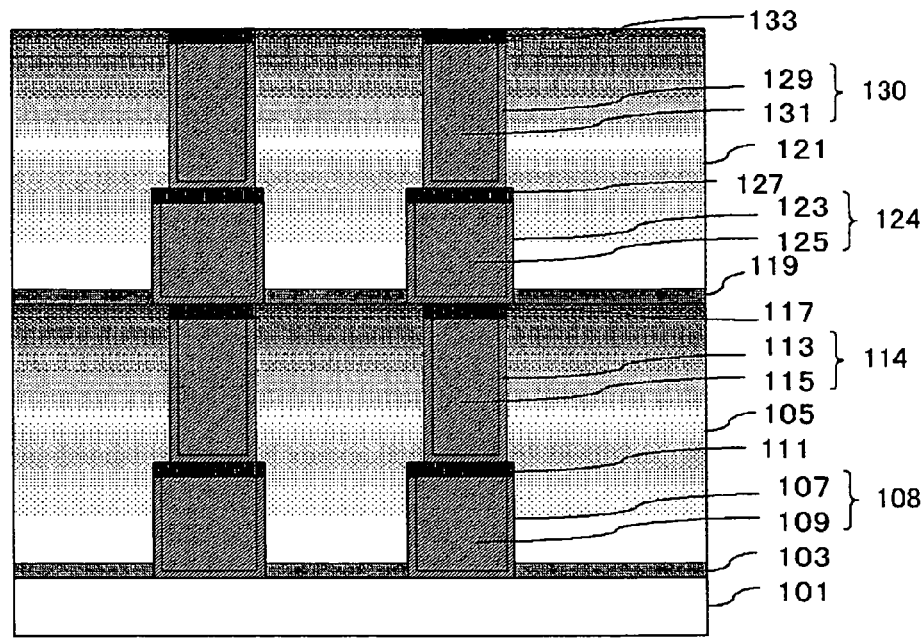
FIGS. 10A and 10B are cross sectional views illustrating the configuration of a semiconductor device according to an embodiment.
Figure 10B:
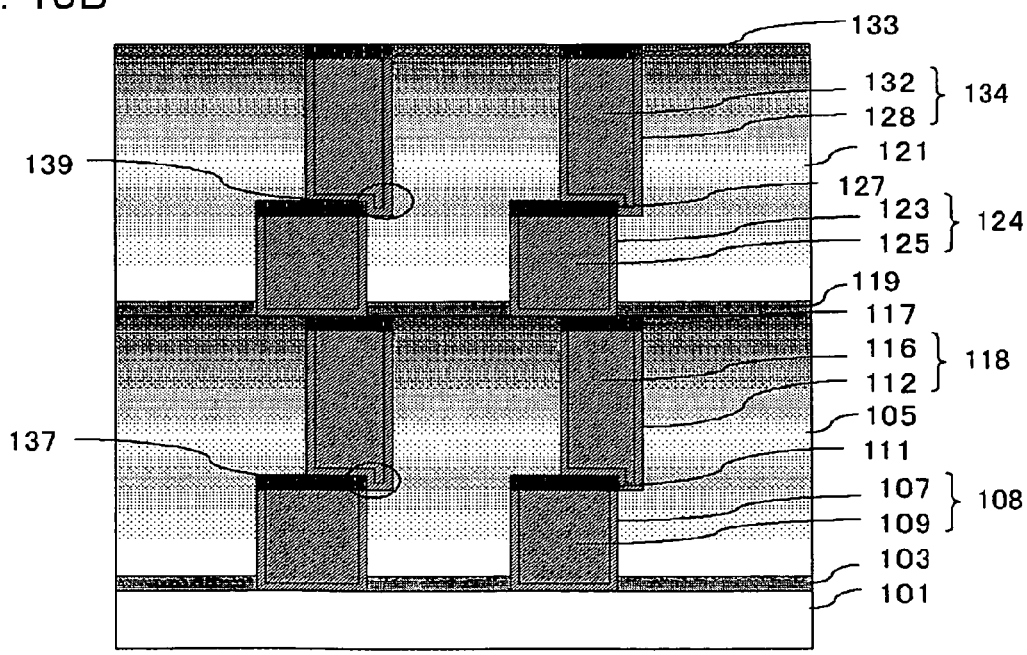

FIGS. 10A and 10B are cross sectional views showing structures of a semiconductor device according to the present embodiment. The semiconductor device 110 shown in FIG. 10B illustrates a structure of the semiconductor device 100 shown in FIG. 10A in which misalignments occur at a connection between the interconnect and via.

The semiconductor device 100 shown in FIG. 10A has the structure in which an insulating interlayer is formed upon a silicon substrate and an multilayer interconnect structure containing copper interconnect and via is provided in the insulating interlayer. The illustrated structure shows a part of multilayer interconnect structure, in which the lower interconnect has a single damascene structure with the lower interconnect connected to the upper interconnect through a conductive via (plug).

The semiconductor device 100 has an interconnect structure which includes a first interconnect (a first interconnect 108) made of a copper containing metal; a first cap metal film (a Cu silicide layer 111) provided on the upper portion of the first interconnect 108 so as to contact therewith for covering the upper portion of the first interconnect 108; a conductive via (a first plug 114) provided on the upper portion of the Cu silicide layer 111 to be connected to the first interconnect 108; an insulating film (a first porous MSQ film 105) provided from the side wall of the first interconnect 108 through the side wall of the first plug 114 so as to form to cover the side wall of the first interconnect 108, the upper portion of the first interconnect 108 and the side wall of the first plug 114; and a reinforcing insulating film (a first SiCN film 103) with greater film density than the first porous MSQ film 105 provided under the first porous MSQ film 105 so as to contact with the lower portion of the side wall of the first interconnect 108.

The interconnect structure is provided on the upper portion of the first plug 114 so as to contact the first plug 114 and has a second cap metal film (a Cu silicide layer 117) that covers the upper portion of the first plug 114.

The first porous MSQ film 105 is contiguously and integrally provided over the side surface from the first interconnect 108 to the first plug 114. The first porous MSQ film 105 is a solid film buried between first interconnects 108 and between the first plugs 114.

The first porous MSQ film 105 is made of low dielectric constant material, and has a higher density in the upper portion than its lower portion. Moreover, the first porous MSQ film 105 has a greater mechanical strength in the upper portion than its lower portion. Furthermore, the first porous MSQ film 105 is made of low dielectric constant material that contains carbon as a constituent element. The first porous MSQ film 105 contains more carbon in the lower portion than its upper portion.

The first porous MSQ film 105 is formed by irradiating with electron beam or ultraviolet light.

As for an infrared absorption spectrum of low dielectric constant material, the peak intensity $I_1$ of the infrared absorption band having a peak in proximity of 1150 $cm^{-1}$ is smaller at the upper portion than the lower portion of the first porous MSQ film 105. The absorption band reflects a cage-type Si—O structure. The range in proximity of 1150 $cm^{-1}$ means herein, for example, 1100 $cm^{-1}$ to 1200 $cm^{-1}$.

Moreover, as for the infrared absorption spectrum of the low dielectric constant material, the peak intensity $I_2$ of the infrared absorption band having a peak in proximity of 1050 $cm^{-1}$ is larger at the upper portion than the lower portion of the first porous MSQ film 105. The absorption band reflects a ladder-type Si—O structure. The range in proximity of 1050 $cm^{-1}$ means herein, for example, 1000 $cm^{-1}$ to 1100 $cm^{-1}$.

Furthermore, as for the infrared absorption spectrum of the low dielectric constant material, the peak intensity $I_3$ of the infrared absorption band having a peak in proximity of 3000 $cm^{-1}$ is smaller at the upper portion than the lower portion of the first porous MSQ film 105. The absorption band is derived from CH bonding. The larger the peak intensity $I_3$ is, the higher the carbon concentration is in the film. The range in proximity of 3000 $cm^{-1}$ means herein, for example, 2950 $cm^{-1}$ to 3050 $cm^{-1}$.

The term "peak intensity" used in the specification refers to a value in which a baseline absorbance of wave number at peak position is subtracted from the absorbance at the peak position, in an infrared absorption band in the infrared absorption spectrum, in other words, in a region surrounded by absorption curve and the baseline. The baseline in each of the infrared absorption bands can usually be given from a value within a range shown below.

$I_1$: 1100 to 1200 $cm^{-1}$ $I_2$: 1000 to 1100 $cm^{-1}$ $I_3$: 3050 to 2800 $cm^{-1}$

Plurality of such interconnect structures is stacked on the semiconductor device 100. The first plug 114 in one interconnect structure is connected to the first interconnect (a second interconnect 124) of other interconnect structures provided on the interconnect structure.

The semiconductor device 100 has a second interconnect (a second interconnect 124) that is provided at the upper portion of the first plug 114 so as to be connected to the first plug 114 and is made of copper-containing metal, and a second reinforcing insulating film (a second SiCN film 119) that is provided at the upper portion of the first porous MSQ film 105 so as to contact with the lower portion of the side wall of the second interconnect 124 and has a greater film density than the first porous MSQ film 105. On the upper portion of the second SiCN film 119, the second porous MSQ film 121 is provided, and the second SiCN film 119 has greater film density than the second porous MSQ film 121.

The following shows a structure of the semiconductor device 100 in greater details.

The semiconductor device 100 has a structure having a multilayer film 101, a first SiCN film 103, a first porous MSQ film 105, a second SiCN film 119 and second porous MSQ film 121 stacked in this sequence on a silicon substrate (not shown). The multilayer film 101 is a film having insulating interlayer and interconnect layer stacked with each other.

The first porous MSQ film 105 is a contiguously integrated film in which a first plug 114 and a region of the first interconnect 108 that is not close to the bottom surface thereof are buried. The second porous MSQ film 121 is a contiguously integrated film in which a second plug 130 and a region of the second interconnect 124 that is not close to the bottom surface thereof are buried.

The first porous MSQ film 105 and second porous MSQ film 121 are insulating interlayers made of low dielectric constant materials. The first porous MSQ film 105 and second porous MSQ film 121 are irradiated by ultraviolet light or electron beam from the upper surface side. The wavelength of the ultra violet light may be, for example, in a range not less than 100 nm and not more than 400 nm.

The first porous MSQ film 105 and the second porous MSQ film 121, have a film density is greater and a more reinforced mechanical property in the upper portion than in the lower portion, that is the side of silicon substrate. The first porous MSQ film 105 and second porous MSQ film 121 may be so structured that the mechanical strength in the upper portion is twice or more greater than that in the lower portion. With this structure, the upper portion of the layer in which the first plug 114 is formed and having low data ratio can be further strengthened, and thereby the more stable production is achieved.

In addition, the first porous MSQ film 105 and the second porous MSQ film 121 may, in the upper portion rather than the lower portion, have a decreased amount of C—H bonding in porous MSQ, or may have an increased amount of ladder-type Si—O bonding in the porous MSQ, or may have a decreased amount of cage-type Si—O bonding in the porous MSQ, or even have a plurality of above conditions may be combined at the same time. Changes in the amount of bonding can be detected, for example, by measuring the amount of infrared absorption.

In the case where further mechanical strength is required, subsequent processing conditions may be controlled so as to easily decrease the carbon concentration of the upper layer. The decrease in the carbon concentration can be easily observed by measuring methods such as SIMS (secondary ion mass spectrometry) and XPS (X-ray photoelectron spectroscopy).

In the first porous MSQ film 105 and the second porous MSQ film 121, the compositions and properties of the films such as the film density, the mechanical strength, the amount of C—H bonding in the porous MSQ, the amount of ladder-type Si—O bonding in the porous MSQ, and the amount of Cage-type Si—O bonding in the porous MSQ may differ between the upper portion and the lower portion of the film. The compositions and properties of the films, for example, may change gradually as apart from the first SiCN film 103.

At a discontinuity surface of the semiconductor device 100 in which the data ratio changes discontinuously, none discontinuity surface is configured that gives discontinuous change to the compositions or properties of the first porous MSQ film 105 and second porous MSQ film 121. Particularly when a low data ratio region is provided on a high data ratio region, no surface that is discontinuous in the compositions or properties of the porous MSQ film exists at a level on which the bottom surface of the low data ratio region lies. Specifically, discontinuity surface in the compositions or properties of the first porous MSQ film 105 and second porous MSQ film 121 exists neither in an identical level with boundary surface of the first interconnect 108 and the first plug 114, nor in an identical level with boundary surface of the second interconnect 124 and second plug 130, respectively.

Moreover, no discontinuity surface in the compositions or properties of the first porous MSQ film 105 and second porous MSQ film 121 exists within a range at least from identical level with the bottom surface of the first interconnect 108 to an identical level with the bottom surface of the interconnect 114, and also from an identical level with the bottom surface of the second interconnect 124 to an identical level with the bottom surface of the second plug 130, respectively, including both ends.

Furthermore, the discontinuity surface in the compositions or properties of the first porous MSQ film 105 and the second porous MSQ film 121 may be provided in a region within a level that is higher than the bottom surface of the first plug 114 and equal to or lower than the top surface of the first plug 114, and higher than the bottom surface of the second plug 130 and equal to or lower than the top surface of the second plug 130, respectively. It is more preferable that the first porous MSQ film 105 and the second porous MSQ film 121 are configured to have no discontinuity surface in the compositions or properties over the films, and thereby achieving greater thermal cycle properties of the first porous MSQ film 105 and the second porous MSQ film 121.

The first SiCN film 103 and the second SiCN film 119 contact with the lower side surface of the first interconnect 108 and the second interconnect 124, and function as a film to support the first interconnect 108 and the second interconnect 124, respectively. The second SiCN film 119 functions as a reinforcing film which is provided between the second porous MSQ film 121 and the first porous MSQ film 105 and strengthens between the interconnect structures in the boundary therebetween where the data ratio of the metal film rapidly increases.

In the first porous MSQ film 105, the first interconnect 108, the Cu silicide layer 111, the first plug 114, and the Cu silicide layer 117 are buried and connected with each other in this sequence. In the second porous MSQ film 121, the second interconnect 124 connected to the Cu silicide layer 117, Cu silicide layer 127, the second plug 130, and Cu silicide layer 133 are buried and connected in this sequence. The first plug 114 and the second plug 130 are conductive via plugs connected to interconnects.

The first interconnect 108 is provided from the first porous MSQ film 105 through the first SiCN film 103, and has a first Cu interconnect 109 and a barrier metal film 107 that covers the side and bottom surfaces of the first Cu interconnect 109, with the top surface of the first Cu interconnect 109 covered with the Cu silicide layer 111. The first interconnect 108 is supported by the first SiCN film 103 at the lower side and fixed on the multilayer film 101.

On the Cu silicide layer 111, a first plug 114 is provided that is electrically connected to the first interconnect 108. The first plug 114 has a first Cu via 115 and a barrier metal film 113 that covers the side and bottom surfaces of the first Cu via 115, and the top surface of the first Cu via 115 is covered with the Cu silicide layer 117.

The second interconnect 124 is provided from the second porous MSQ film 121 through the second SiCN film 119, and has the second Cu interconnect 125 and a barrier metal film 123 that covers the side and bottom surfaces of the second Cu interconnect 125, with the top surface of the second Cu interconnect 125 covered with the Cu silicide layer 127. The second interconnect 124 is supported at the lower side by the second SiCN film 119 and fixed on the first porous MSQ film 105.

On the silicide layer 127, a second plug 130 is provided that is electrically connected to the second interconnect 124. The second plug 130 has a second Cu via 131 and a barrier metal film 129 that covers the side and bottom surfaces of the second Cu via 131, and the top surface of the second Cu via 131 is covered with the Cu silicide layer 133.

FIGS. 10A and 10B share a basic configuration of the semiconductor device 110 except that instead of the first plug 114, FIG. 10B illustrates a first plug 118 provided with a barrier metal film 112 and a first Cu via 116, and the first plug 118 has misalignments 137, in addition, instead of the second plug 130, FIG. 10B illustrates a second plug 134 provided with a barrier metal film 128 and the second Cu via 132, and the second plug 134 has misalignments 139.

A method of manufacturing the semiconductor device 100 shown in FIG. 10A is described hereinafter. FIGS. 1A to 9A are cross sectional views of a process of manufacturing the semiconductor device 100.

According to the present embodiment, the manufacturing method includes:

forming the first reinforcing insulating film (the first SiCN film 103) and the first sacrificial interlayer film (the first $SiO_2$ film 141) in this sequence;

forming a first trench from the first $SiO_2$ film 141 through the first SiCN film 103, then in the first trench, forming the first interconnect (the first interconnect 108) made of a copper-containing metal, and forming a first cap metal film (Cu cillicide layer 111) for covering the upper portion of the first interconnect 108;

on the upper portion of the Cu cillicide layer 111, forming a sacrificial barrier dielectric film (the sacrificial SiCN film 143) and a second sacrificial interlayer film (the second sacrificial $SiO_2$ film 145) in this order;

selectively removing the second sacrificial $SiO_2$ film 145 and the sacrificial SiCN film 143 sequentially to form a hole with the Cu cillicide layer 111 exposed at the bottom thereof, forming a conductive film in the hole so as to form a conductive via (the first plug 114) to be connected to the first interconnect 108 and forming a second cap metal film (the Cu cillicide layer 117) covering the first plug 114 on the first plug 114;

exposing the first interconnect 108 and the first plug 114 by removing the second sacrificial $SiO_2$ film 145, the sacrificial SiCN film 143, and the first $SiO_2$ film 141 sequentially after formation process of the Cu silicide layer 117; and forming the insulating film (the first porous MSQ film 105) covering the side wall of the first interconnect 108, the upper portion of the first interconnect 108, and the side wall of the first plug 114 from the side wall of the first interconnect 108 through the side wall of the first plug 114.

The above process is repeated to form a multilayer interconnect structure.

After a process of forming the first porous MSQ film 105 that is made of low dielectric constant material, a densification process is performed to make the upper portion of the first porous MSQ film 105 denser than the lower portion thereof. The densification process of the upper portion of the first porous MSQ film 105 than the lower portion thereof includes irradiating an electron beam or ultra violet light onto the first porous MSQ film 105.

After forming of the first porous MSQ film 105, the subsequent process includes: forming a second reinforcing insulating film (the second SiCN film 119) and a third sacrificial interlayer film (the $SiO_2$ film; not shown) on the upper portion of the first porous MSQ film 105 in this sequence; and forming a second trench from the third sacrificial interlayer film through the second SiCN film 119, forming a second interconnect (the second interconnect 124) made of a copper-containing metal and forming a third cap metal film (the Cu silicide layer 127) covering the upper portion of the second interconnect 124.

A manufacturing method in the present embodiment further includes processes of: planarizing the first porous MSQ film 105 by way of mechanical-chemical polishing after forming the first porous MSQ film 105; and then stopping the polishing process at the Cu silicide layer 117 on the first plug 114.

The method for manufacturing the semiconductor device 100 will be described hereinafter in greater details.

Figure 1A:
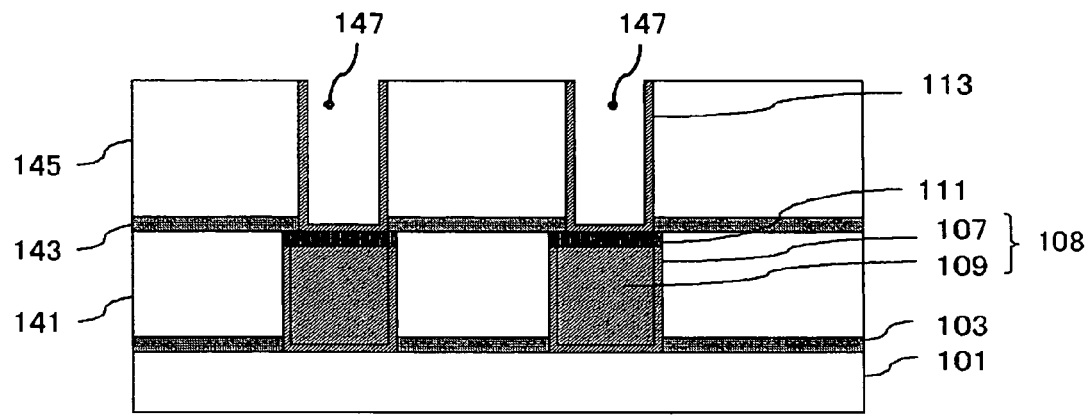
FIGS. 1A and 1B are cross sectional views illustrating the manufacturing process of semiconductor device according to an embodiment.

Firstly, as shown in FIG. 1A, approximately 20 nm to 50 nm of the first SiCN film 103 is formed as a first reinforcing insulating film, and then approximately 70 nm to 200 nm in a layer thickness of the first $SiO_2$ film 141 is formed as a first sacrificial interlayer film. The first SiCN film 103 and the first $SiO_2$ film 141 are processed to form an interconnect trench by using a lithographic technique.

Next, approximately 10 nm to 30 nm of Ta-containing metal film is formed as the barrier metal film 107, and approximately 50 nm to 150 nm of a Cu seed film (not shown) is then formed by sputtering. In addition, approximately 200 nm to 600 nm of Cu plating film is formed by plating so that the interconnect trench is buried to form a buried first interconnect 108 in the interconnect trench by CMP (Chemical Mechanical Polish).

Then, the upper portion of the first Cu interconnect 109 is silicided, specifically, $SiH_4$ process is conducted on the upper portion of the first Cu interconnect 109 to selectively form approximately 2 nm to 15 nm of the Cu silicide layer 111 that functions as a cap metal. Approximately 20 nm to 50 nm of the sacrificial SiCN film 143 is formed on the Cu silicide layer 111 and approximately 70 nm to 200 nm of the second sacrificial $SiO_2$ film 145 is then formed on the sacrificial SiCN film 143.

A via hole 147 penetrating through the second sacrificial $SiO_2$ film 145 and the sacrificial SiCN film 143 is formed by using the lithography technique and approximately 10 nm to 30 nm of Ta-containing metal film is formed as a barrier metal film 113 over the entire upper surface of the second sacrificial $SiO_2$ film 145 (FIG. 1A). Approximately 50 nm to 150 nm of Cu seed film (not shown) is formed by sputtering. Cu plating film is grown by plating to approximately 100 nm to 300 nm starting from the Cu seed film and buried in the via hole 147.

The Cu plating film provided at the outer portion of the via hole 147 is removed by CMP to yield the first Cu via 115, and thereby forming the first plug 114 buried in the via hole 147. The upper surface of the first Cu via 115 is silicided, specifically a $SiH_4$ treatment is performed. This selectively forms on the upper portion of the first Cu via 115 approximately 2 nm to 15 nm of Cu silicide layer 117 that functions as a cap metal (See FIG. 2A).

Figure 3A:
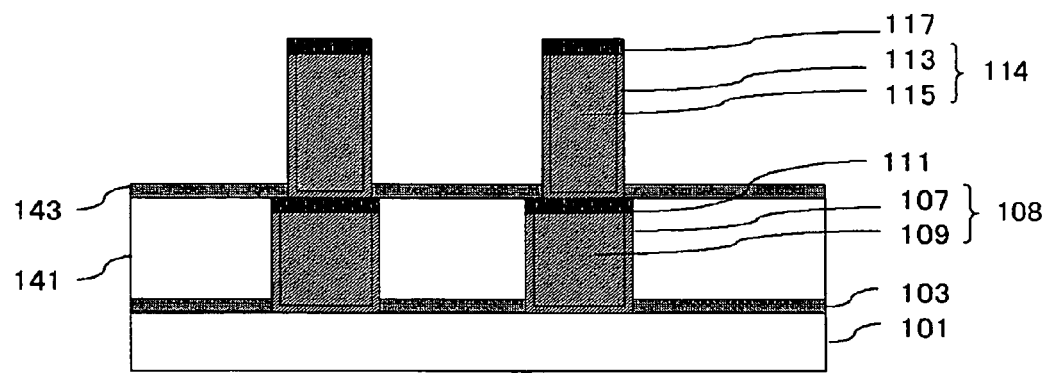
FIGS. 3A and 3B are cross sectional views illustrating the manufacturing process of semiconductor device according to an embodiment.
Figure 3B:
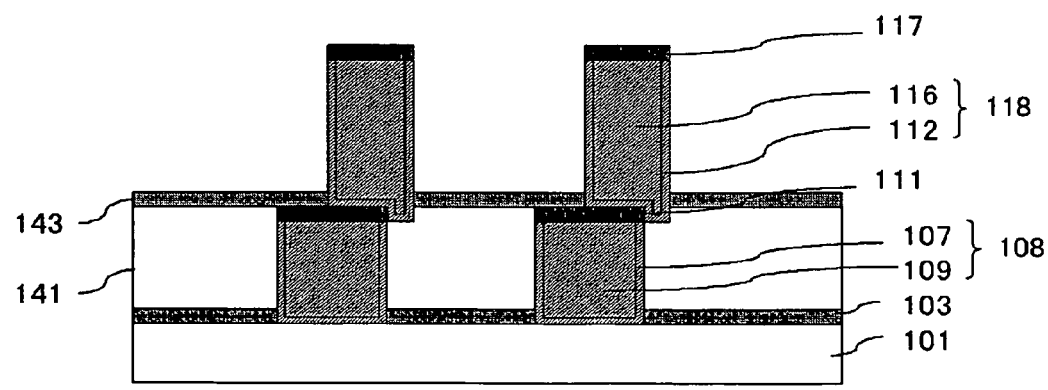
Figure 4A:
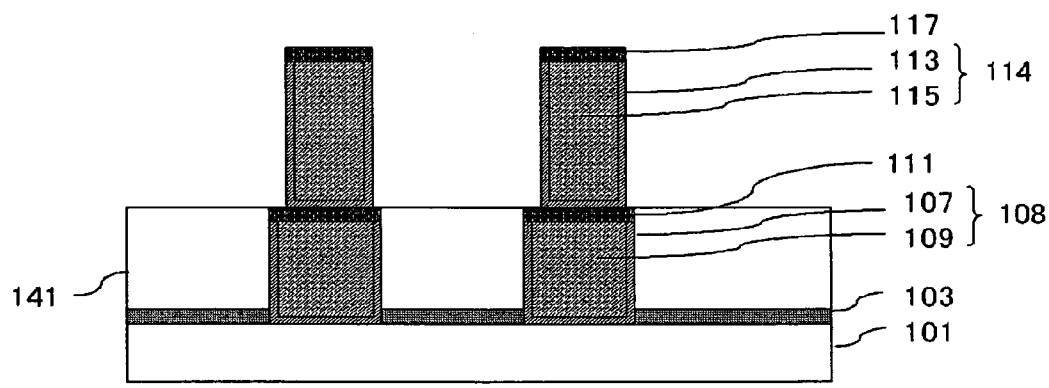
FIGS. 4A and 4B are cross sectional views illustrating the manufacturing process of semiconductor device according to an embodiment.
Figure 4B:
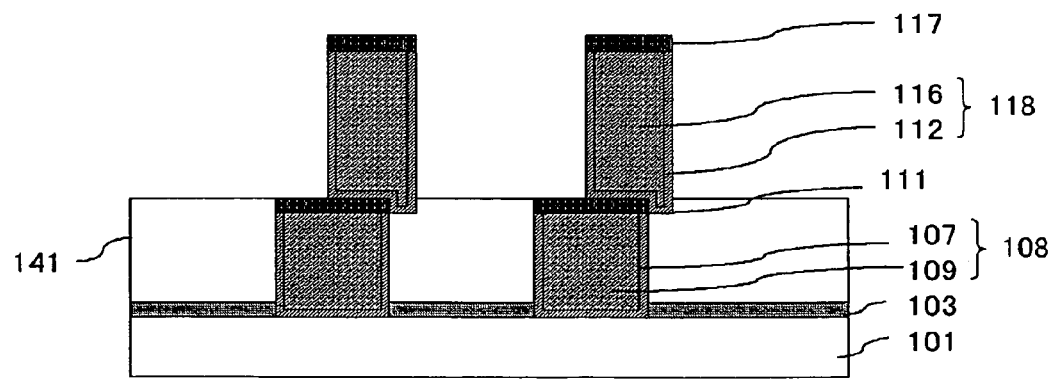
Figure 5A:
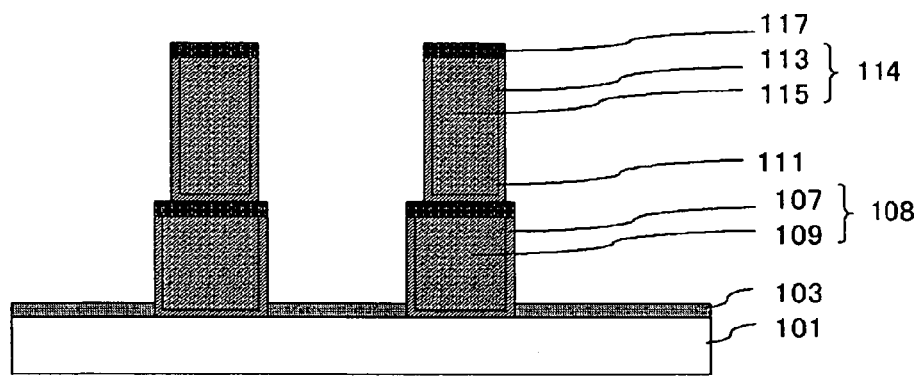
FIGS. 5A and 5B are cross sectional views illustrating the manufacturing process of semiconductor device according to an embodiment.
Figure 5B:
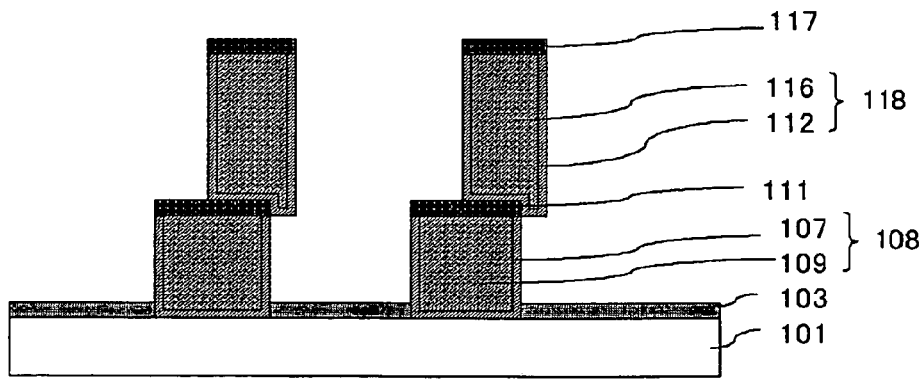
Figure 6A:
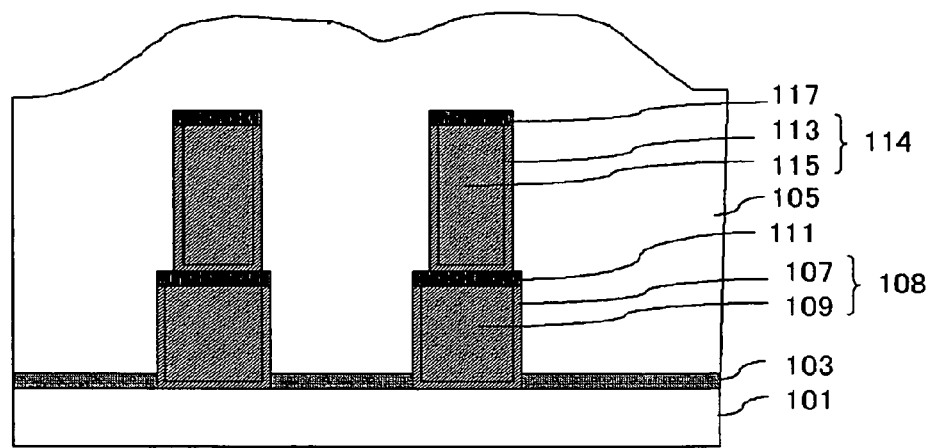
FIGS. 6A and 6B are cross sectional views illustrating the manufacturing process of semiconductor device according to an embodiment.
Figure 6B:
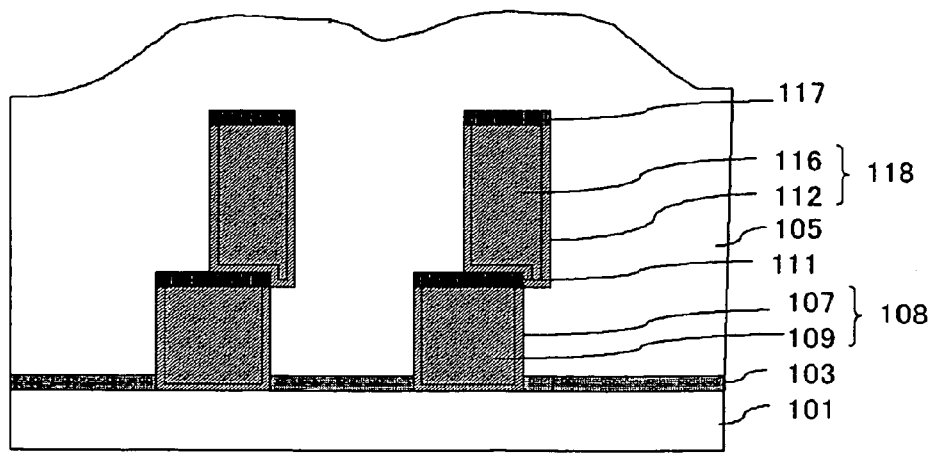

The Cu silicide layer 117 is used as an etching mask and a second sacrificial $SiO_2$ film 145 is removed by wet etching (See FIG. 3A). Buffered HF (fluoric acid) is used, for example, as an etchant. The sacrificial SiCN film 143 is then removed by dry etching (See FIG. 4A). The first $SiO_2$ film 141 is removed by wet etching by using the buffered HF (See FIG. 5A), and thereby exposing the side and upper surfaces of the first plug 114 and the first interconnect 108.

Figure 7A:
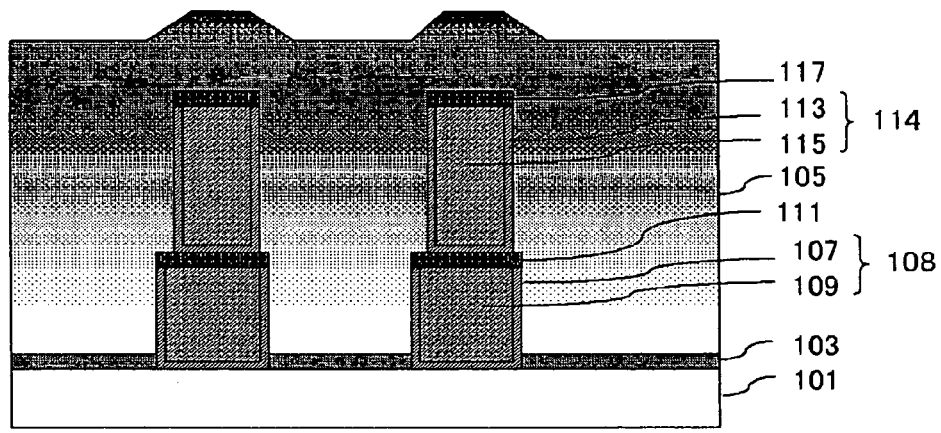
FIGS. 7A and 7B are cross sectional views illustrating the manufacturing process of semiconductor device according to an embodiment.
Figure 7B:
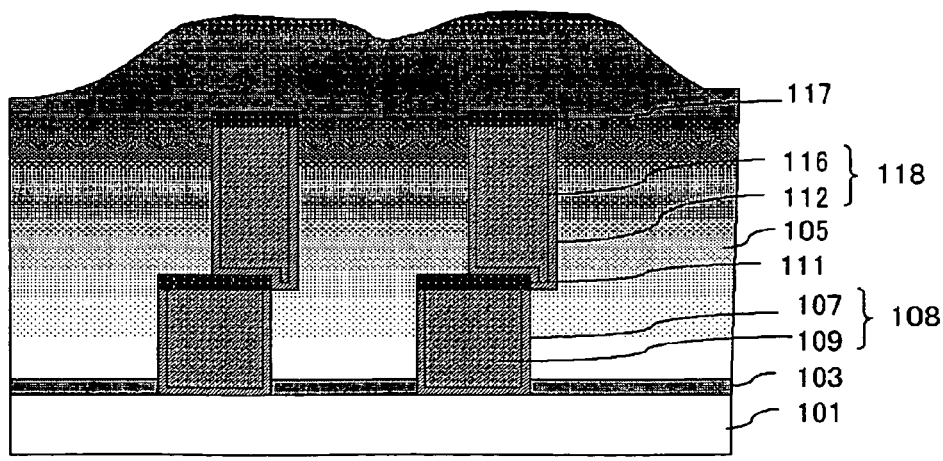
Figure 8A:
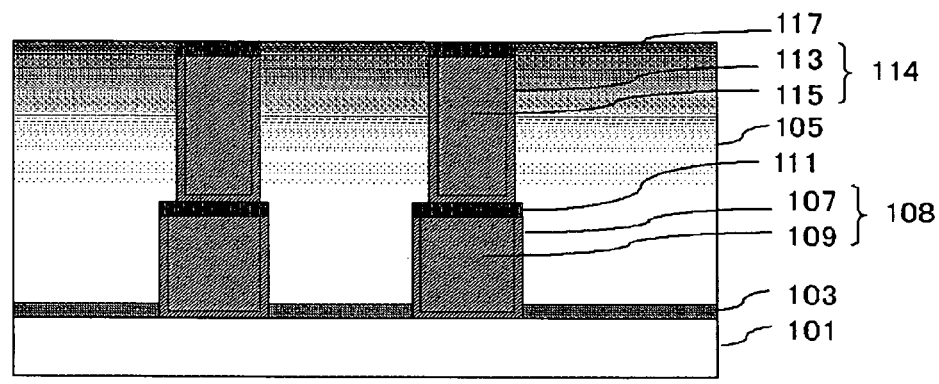
FIGS. 8A and 8B are cross sectional views illustrating the manufacturing process of semiconductor device according to an embodiment.
Figure 8B:
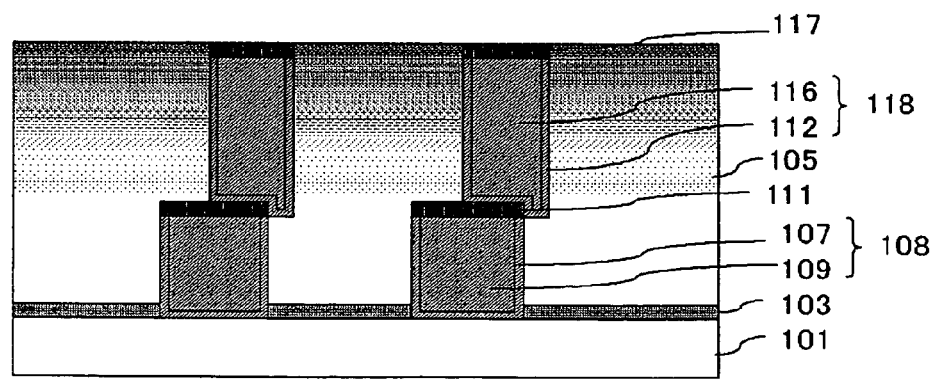
Figure 9A:
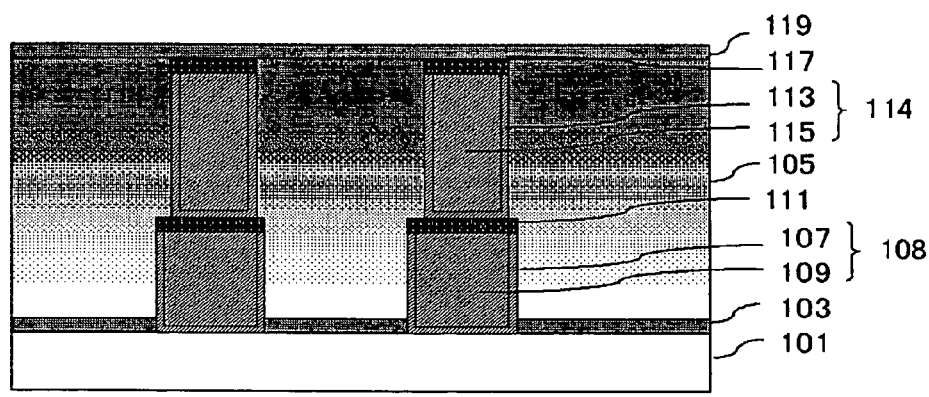
FIGS. 9A and 9B are cross sectional views illustrating the manufacturing process of semiconductor device according to an embodiment.
Figure 9B:
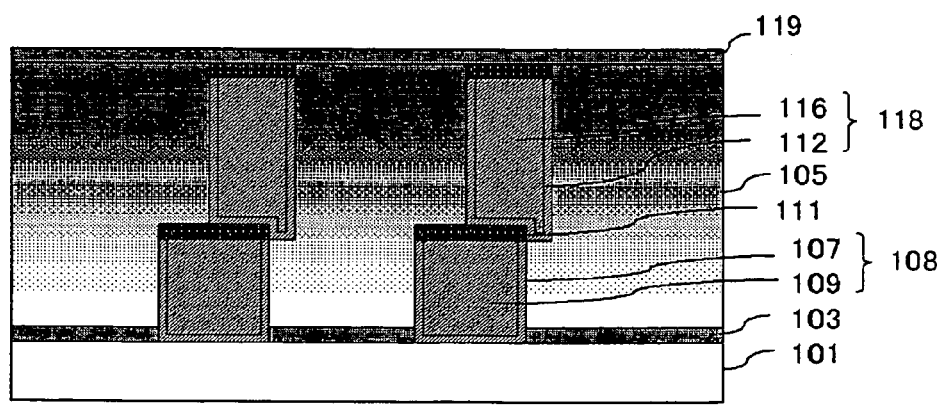

In this way, the insulating film provided as a sacrificial film is removed and then approximately 70 nm to 200 nm of the first porous MSQ film 105 is applied so as to cover the entire upper surface of the silicon substrate and fills the gap between the first interconnects 108 and then baked to obtain an insulating film that contacts with the first plug 114 and the first interconnect 108 (See FIG. 6A) Thereafter, EB treatment is performed in which EB (electron beam) is irradiated over the upper surface of the first porous MSQ film 105 in order to increase the strength of the film 105 (FIG. 7A). Then, the Cu silicide layer 117 is used as a CMP mask in the CMP process of the first porous MSQ film 105, and thereby planarizing the surface of the first porous MSQ film 105 (FIG. 8A).

Above procedure is repeated from the formation process of the second SiCN film 119 (FIG. 9A), to form the barrier metal film 123, the second Cu interconnect 125, the Cu silicide layer 127, the barrier metal film 129, the second Cu via 131, and the Cu silicide layer 133 in the sacrificial film. Subsequently, the sacrificial film is removed and the region where the sacrificial film is removed is filled with the second porous MSQ film 121 to increase the strength. The multilayer interconnect structure shown in FIG. 10A is thus formed on the silicon substrate (not shown) in order to obtain the semiconductor device 100.

Figure 1B:
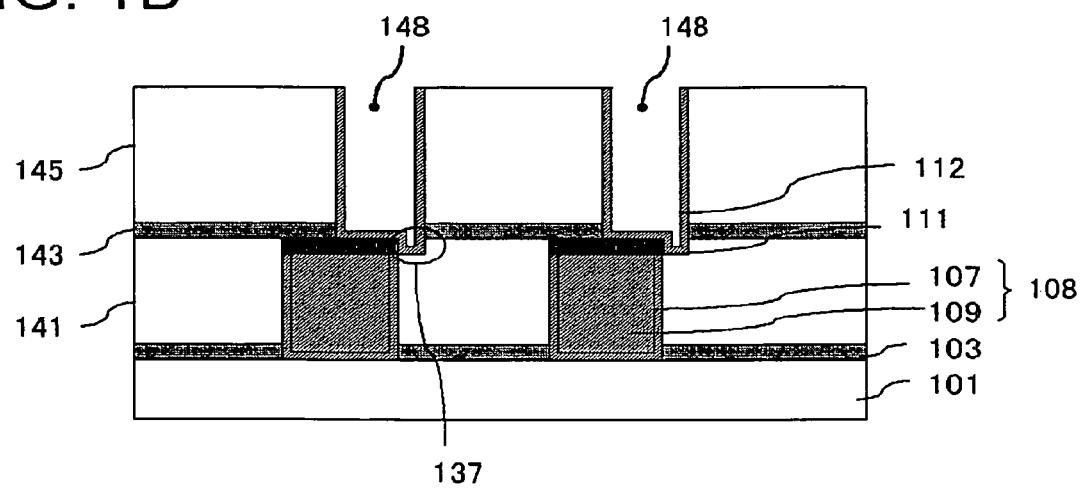
Figure 2A:
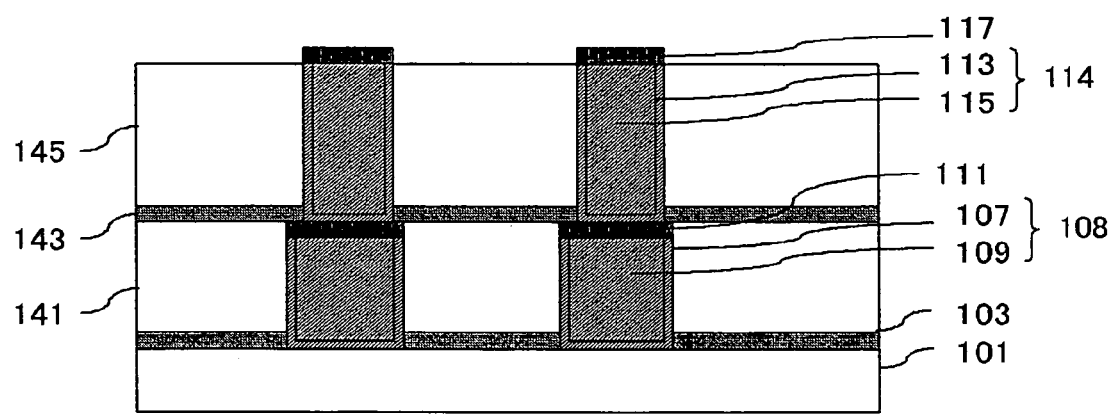
FIGS. 2A and 2B are cross sectional views illustrating the manufacturing process of semiconductor device according to an embodiment.
Figure 2B:
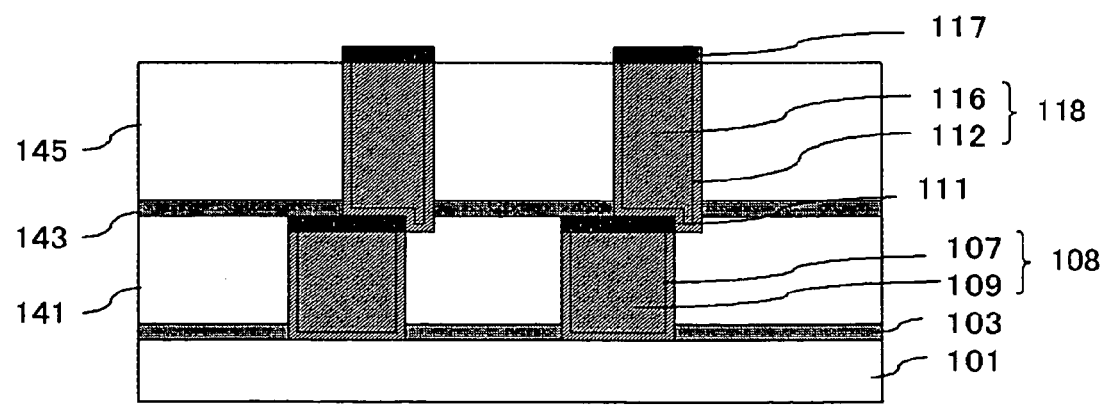

The semiconductor device 110 shown in FIG. 10B is manufactured according to the procedure shown in FIGS. 1B to 9B. Each of processes in FIGS. 1B to 9B corresponds to each of processes in FIGS. 1A to 9A. The basic manufacturing process of the semiconductor device 110 is similar to that of the semiconductor device 100, except that, as shown in FIG. 1B, misalignment occurs during formation of via hole on the upper portion of the first Cu interconnect 109, and that instead of the first Cu via 115, the first Cu via 116 is buried in the via hole 148 with misalignment 137. Other differences in basic manufacturing process between the semiconductor devices 110 and 100 are that instead of the second Cu via 131, the second Cu via 132 with misalignment 139 is formed on the upper portion of the second Cu interconnect 125.

Effects of the present embodiment are described hereinafter.

In the present embodiment, the first porous MSQ film 105 is provided contiguously and integrally from the side surface of the first interconnect 108 through the side surface of the first plug 114. The first interconnect 108 and the first plug 114 are formed and then the first porous MSQ film 105 is formed. The second porous MSQ film 121 has a similar configuration to the first porous MSQ film 105. Cap metals are provided at the upper portion of the interconnect and plug. In addition, the lower portion of the each side surface of the first interconnect 108 and the second interconnect 124 is supported by the first SiCN film 103 and the second SiCN film 119, respectively. Such configurations give the following effects.

Figure 14:
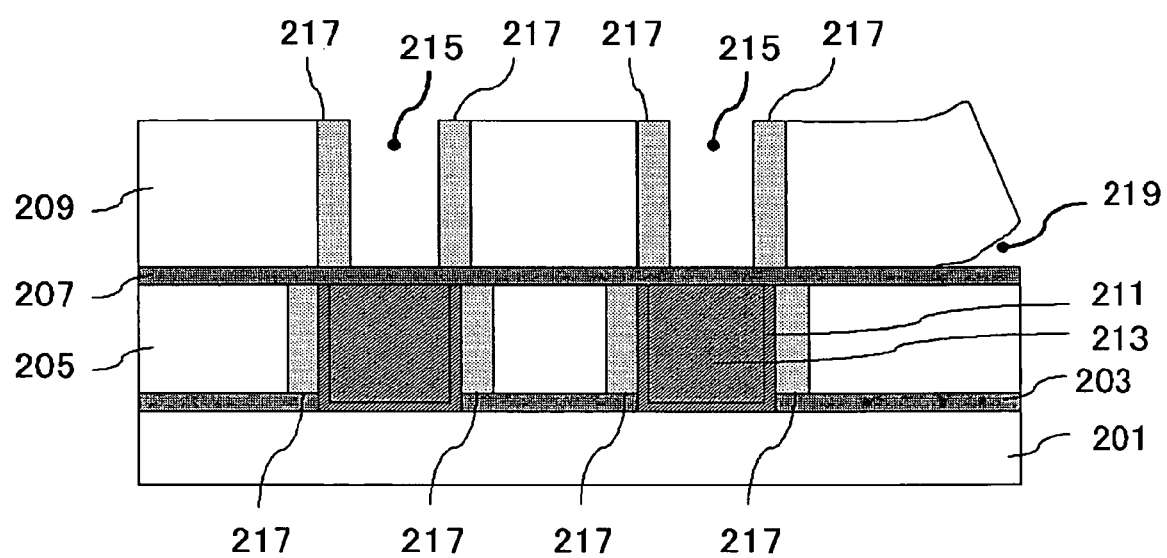
FIG. 14 is a cross sectional view illustrating a conventional manufacturing process of semiconductor device.

Firstly, the first porous MSQ film 105 is buried after the first interconnect 108 and the first plug 114 are formed. This sequence eliminates a refining process of the first porous MSQ film 105 after the formation process, and thus neither etching nor ashing of the first porous MSQ film 105 is required. Eliminating such process can reduce damage in proximity of the interface between the first interconnect 108 and the first plug 114. This prevents the formation of the damaged layers described above with reference to FIG. 14 and ensures manufacturing stability.

Figure 15:
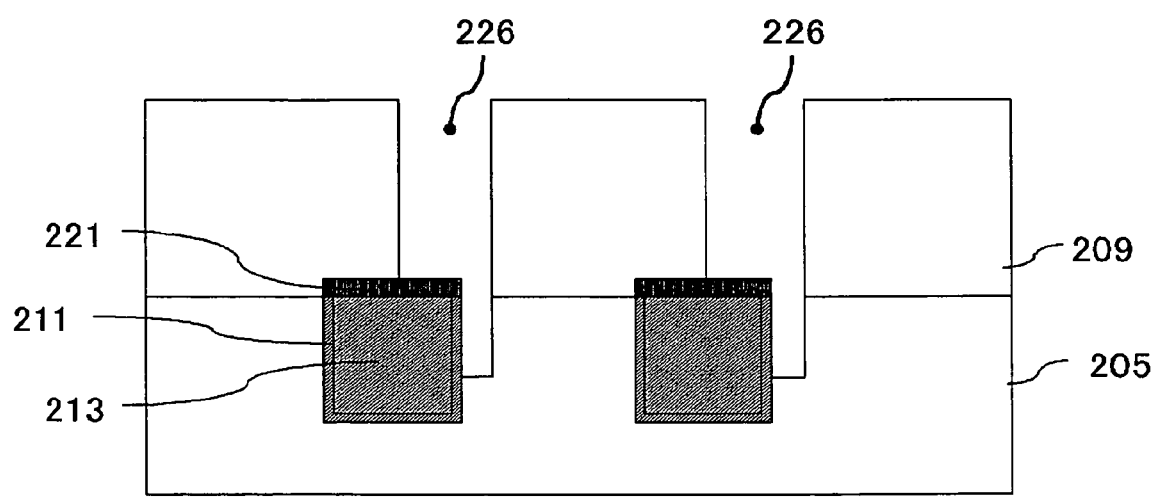
FIG. 15 is a view illustrating a configuration of conventional semiconductor device.

After the formation of the first interconnect 108, on the first Cu interconnect 109 is formed the Cu silicide layer 111 and the via hole 147 is formed with the first $SiO_2$ film 141 and the sacrificial SiCN film 143 stacked on, which will be removed at a later process (FIGS. 1A and 1B). As shown in FIGS. 1B and 10B, even when the misalignment occurs during the formation of the via hole 148, the etching is controlled so that misalignment will not advance in a depth direction at the misalignment 137, thereby suppressing defective burial properties of the barrier metal film 113 and the first Cu via 115 that constitute the first plug 114. This configuration can ensure greater manufacturing stability in the case where there are misalignments comparing with the configuration mentioned above with reference to FIG. 15. The sacrificial SiCN film 143 that function as an etching stopper film and first $SiO_2$ film 141 are processed during the formation of the via hole 147 and via hole 148, with no processing of a so-called unlanded via in the first porous MSQ film 105, thereby the first plug 118 can thus be manufactured in a stable manner in the first porous MSQ film 105 even when the unlanded via exists due to occurrence of misalignment.

Figure 16A:
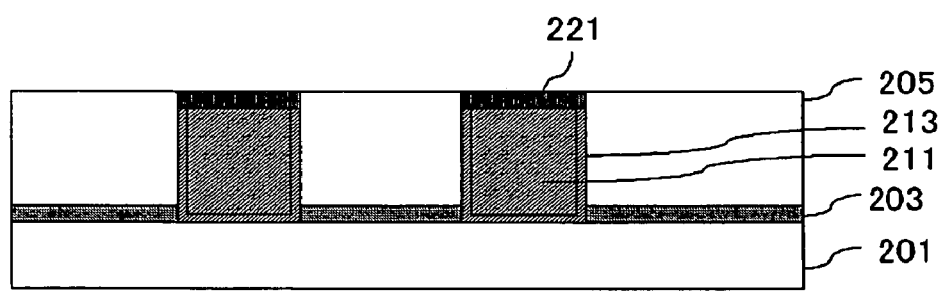
FIGS. 16A and 16B are cross sectional views illustrating the manufacturing process of a semiconductor device.
Figure 16B:
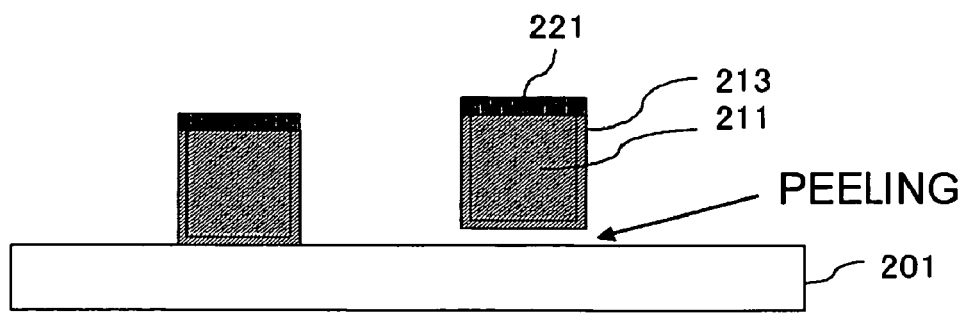

In the present embodiment, the first SiCN film 103 and the second SiCN film 119 are formed on the side wall of the lower portion of the first interconnect 108 and the second interconnect 124, respectively, in order to support the lower portion of the interconnects, and to reinforce and protect the interface of the lower portion of the interconnects. With this configuration, the interconnect can be kept from lifting-off during etching process for removing the first $SiO_2$ film 141. This ensures more stable production comparing with the case mentioned above with reference to FIG. 16B. Formation of SiCN film at the side wall of the lower portion of the interconnect fixes the interconnect, and reinforces the bottom side of the porous MSQ film to make its mechanical strength higher even when a porous MSQ film with a relatively low density and low mechanical strength is used as an insulating interlayer. This can also solve the bonding process during assembling.

In the present embodiment, the sacrificial SiCN film 143 provided between the interconnect layer and the plug layer is removed during manufacturing process, and the first porous MSQ film 105 is a contiguous and integral film. This configuration has no stacked structure of films made of different materials within a range from a level in which the bottom surface of the first interconnect 108 is provided and to a level in which the bottom surface of the first plug 114 is provided. In a configuration in which the first plug 114 is connected upon the first interconnect 108, the data ratio changes largely and discontinuously in their borderline region because the data ratio of the first plug 114 formed layer is significantly smaller than the data ratio of the first interconnect 108 formed layer. In conventional configurations as mentioned above with reference to FIG. 14, there is an interface between relatively dense barrier dielectric film 207 and the second low-k film 209 at a borderline region where the data ratio changes largely. In this configuration, in which the discontinuity surface of the data ratio and the discontinuity surface of the film structure are at a same level, a peeling off often occurs in the T/C cycle at the interface between an insulating interlayer of the plug formation layer having a low data ratio, that is, the second low-k film 209 and barrier dielectric film 207.

In contrast, in the present embodiment, there is no interface between the first porous MSQ film 105 and the second porous MSQ film 121, and other films at a level in the bottom surface of the first plug 114 and the second plug 130, respectively. The first porous MSQ film 105 and the second porous MSQ film 121 are films in which the compositions and properties change gradually along a normal direction to the film, and the discontinuity surfaces in compositions and properties do not exist at a level in which the bottom surface of the first plug 114 and the second plug 130 is disposed, respectively. Therefore, peeling off due to a difference between coefficients of thermal expansion in stacked layer film will not occur, and greater thermal cycle properties can be achieved. Additionally, the configuration is made to have no interface of film with different dielectric constant, so that the dielectric constant of the insulating interlayer can be more effectively lowered.

There is no discontinuity surface in compositions and properties within a range from a level in which the bottom surface of the first interconnect 108 is disposed to a level in which the bottom surface of the plug 114 is disposed, and so that a peeling-off or a degradation in low-density region in the first porous MSQ film 105 can more certainly be inhibited. In an upper level than the bottom surface of the first plug 114, the first porous MSQ film 105 is highly densed than the lower portion thereof, and so that the discontinuity surface in compositions and properties may exist, however, it is preferable that the compositions and properties of the first porous MSQ film 105 change gradually and that discontinuity surface does not exist. This may further improve stable production of the interconnect structure.

In addition, in the present embodiment, the first porous MSQ film 105 is highly densed and achieves greater mechanical strength in proximity to the upper surface of the first porous MSQ film 105, namely, in proximity to the interface of the layer in which the second interconnect 124 is formed. The second SiCN film 119 is provided between the first porous MSQ film 105 and the second porous MSQ film 121, and the second SiCN film 119 functions as a supporting film of the second interconnect 124.

Thus, in a normal direction to a semiconductor substrate (not shown), a region having larger data ratio of metal film is provided with the second porous MSQ film 121 of low-density in order to fully reduce the relative dielectric constant and thus reduce the capacitance across the interconnects. In addition, at the boundary surface to the first plug 114 formed region, the second SiCN film 119 is provided as the lower layer of the second porous MSQ film 121 so that the second SiCN film 119 reinforces the second porous MSQ film 121 in order to ensure the sufficient strength in the area where the porous MSQ film is formed reduces rapidly. With this, each of the second porous MSQ film 121 and the first porous MSQ film 105 is provided contiguously and integrally, so that further strength can be achieved in the interconnect structure than in the case where the proximity of the interface between the first plug 114 and the second interconnect 124 are covered with a single film.

As described above, in the present embodiment, an etching stopper between the first interconnect 108 and the first plug 114, and an etching stopper between the second interconnect 124 and the second plug 130 are removed, and the first porous MSQ film 105 and the second porous MSQ film 121 are contiguously formed to achieve lower density and lower dielectric constant of the films. Moreover, in the present embodiment, the region between the first plug 114 and the second interconnect 124 where the data ratio increases rapidly is densified, and additionally the first SiCN film 103 and the second SiCN film 119 are provided to reinforce the first porous MSQ film 105 and the second porous MSQ film 121, and therefore achieving lower dielectric constant and more stable production.

Moreover, in the present embodiment, the interconnect and plug are formed through single damascene process, and the upper portion of the interconnect and plug are provided with silicide layers as a cap metal film, such that the migration of a copper or a copper-containing metal that constitutes the interconnect and plug are suppressed. Comparing with a dual damascene process described above in the BACKGROUND, or in U.S. Pat. No. 6,413,852, and S. Nitta et al. (December 2004) "Successful Dual Damascene Integration of Extreme Low k Materials (k<2.0) Using a Novel Gap Fill Based Integration Scheme", IEDM 2004 Proceedings, IEEE, U.S., the single damascene process can increase yields and achieve more stable production.

Furthermore, in the present embodiment, the Cu silicide layer 117 and Cu silicide layer 133 that function as a metal cap are provided on the upper portion of the first plug 114 and second plug 130, respectively. This can suppress a so-called Stress Induced Void (SIV) in the proximity of the interface between the copper interconnect and the via plug connected to the upper portion thereof. This further suppresses an increase in contact failure or interconnect resistance so as to improve the reliability of the semiconductor device.

The present embodiment describes the case in which the first porous MSQ film is used as a low dielectric constant insulating film, however, the present embodiment or the following embodiment may use polyorganosiloxane film, siloxane hydride film, or the porous films thereof as a insulating film. Manufacturing method of these films is not limited but may use a chemical vapor deposition method or an application method.

Polyorganosiloxane includes, for example, methylpolysiloxane such as MSQ (methyl silsesquioxane);

methyl hydrogen polysiloxane such as MHSQ (methyl hydrogen silsesquioxane);

OSG (Organo-Silicate Glass); and

CDO (Carbon Doped Oxide).

Alternatively, siloxane hydride includes, for example, HSQ (hydrogen silsesquioxane); and ladder-oxides such as ladder type hydrogen silsesquioxane. The ladder type hydrogen silsesquioxane, that is a polymer with ladder type molecular structure, preferably have not more than 2.9 of dielectric constant in terms of preventive purpose of interconnect delay, and preferably have a lower film density. For example, the film density is preferably not less than 1.50 $g/cm^2$ and not more than 1.58 $g/cm^2$, and the index of refraction of 633 nm is preferably not less than 1.38 and not more than 1.40. As a specific example of such film material, so-called a "ladder oxide" or "L-Ox™" (trademark) (hereinafter referred to as "L-Ox") may be illustrated. A porous insulation material of L-Ox may also be used.

As low dielectric constant insulating film, organic resin films such as parylene resin;

fluorine resin such as "Cytop" (registered trademark);

non-fluoride aromatic-containing organic resin such as "SILK" (registered trademark);

polyaryl ether (PAE); and polyphenylene may be used.

The relative dielectric constant of low dielectric constant film may be not more than 3.5, preferably, not more than 3.0. The low dielectric constant film may be a film that contains Si, O, and H as constituent elements, or Si, C, O, and H as constituent elements. Even with use of such other films, however, by adopting configurations described above in the embodiment, the similar effect as in semiconductor device 100 or semiconductor device 110 shown in FIGS. 1A and 1B is obtainable.

In the present embodiment, a configuration is described in which SiCN film is the reinforcing insulating film that is provided just below the first porous MSQ film 105 and the second porous MSQ film 121, however, the reinforcing insulating film may be any of films that is further densified than the first porous MSQ film 105 and the second porous MSQ film 121, and that can reinforce regions with lower density and strength, such as a surface of the insulating interlayer with low dielectric constant provided at a boundary between the interconnect layer and plug layer, specifically, in proximity of bottom surface of the insulating interlayer of low dielectric constant. For example, an SiC film or an SiON film may be used here instead of the SiCN film.

As for a combination of the low dielectric constant film and the reinforcing insulating film, the insulating film may be aforementioned polyorganosiloxane film, a siloxane hydride film, or porous films thereof, the reinforcing insulating film may be an SiC film, an SiCN film or an SiON film. It is more preferable that a combination of porous SiOC film and SiC are used.

In the following embodiment, differences with the first embodiment are essentially described.

Second Embodiment

The first embodiment shows a configuration in which the first porous MSQ film 105 and second porous MSQ film 121 are solid, however, the configuration may be such that air-gap is provided in the insulating film, in which the insulating film is provided from the sidewall of the first interconnect 108 through the sidewall of the first plug 114 in order to cover the side wall of the first interconnect 108, the upper portion of the first interconnect 108 and the sidewall of the first plug 114. Similarly, the insulating film provided from the sidewall of the second interconnect 124 through the sidewall of the second plug 130 may be configured to have air-gaps. In this embodiment, such configuration is described.

Figure 11A:
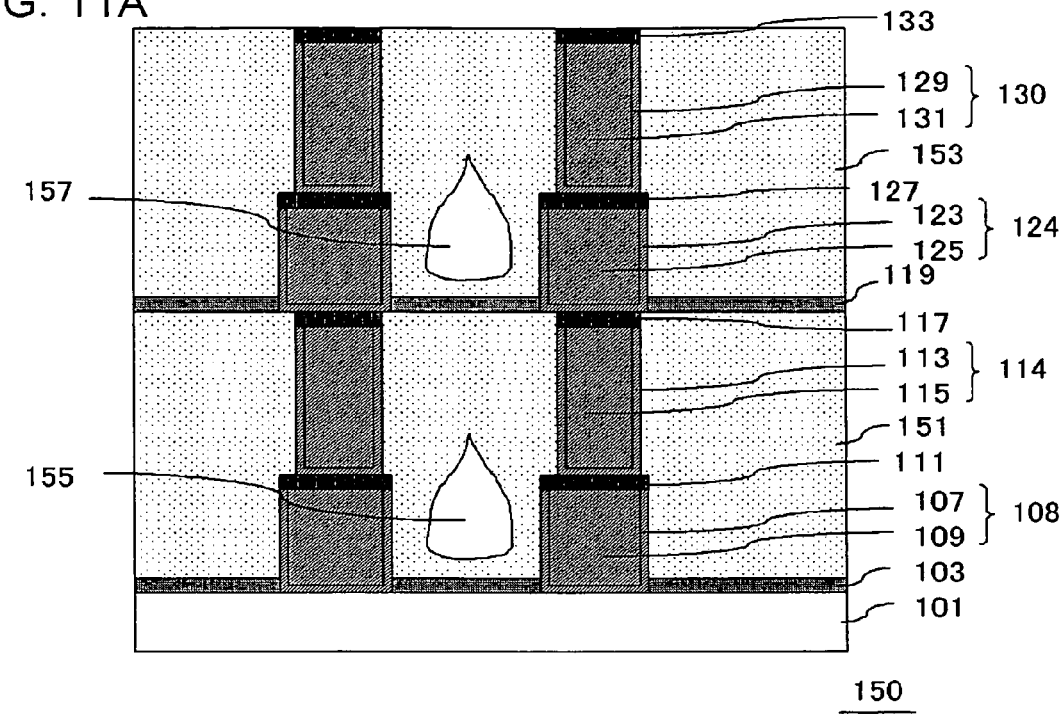
FIGS. 11A and 11B are cross sectional views illustrating the configuration of semiconductor device according to an embodiment.
Figure 11B:
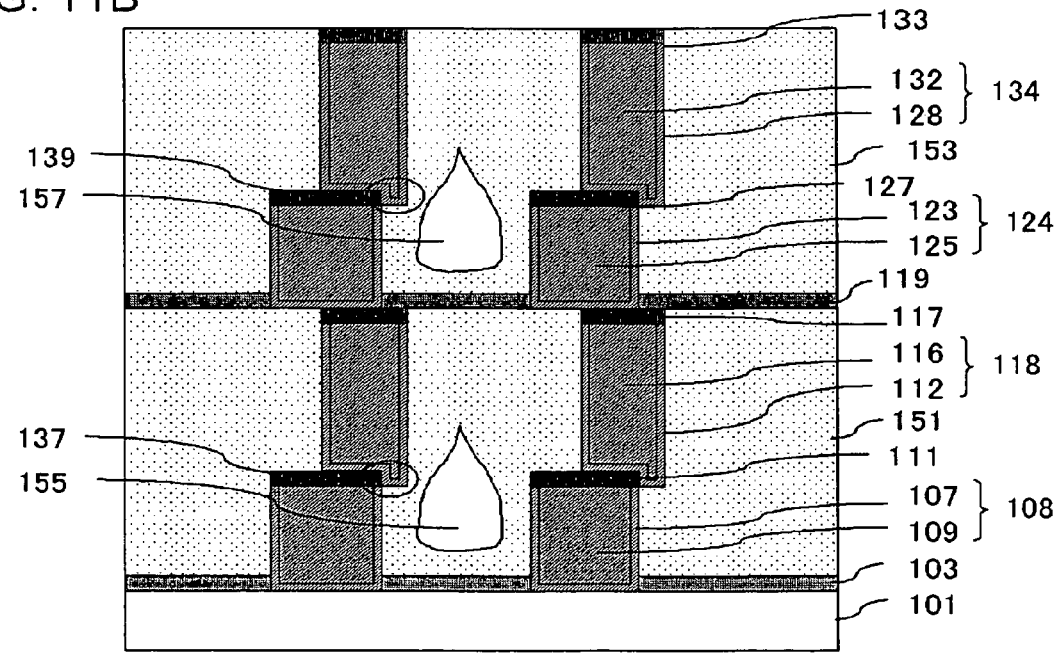

FIGS. 11A and 11B are cross sectional views showing configurations of semiconductor devices of the present embodiment. FIG. 11B shows a semiconductor device 160 in which misalignments occurs at a connecting point of the interconnect and via in the semiconductor device 150 shown in FIG. 11A.

The semiconductor device shown in FIGS. 11A and 11B respectively have a basic configuration of semiconductor device shown in FIGS. 10A and 10B, however, instead of using the first porous MSQ film 105 and the second porous MSQ film 121, the first SiOC film 151 and the second SiOC film 153 is provided respectively. The first SiOC film 151 and the second SiOC film 153, respectively, is provided with air-gap 155 and air-gap 157. The air-gap 155 and air-gap 157 are provided between the first interconnects 108 and between the second interconnects 124, respectively, and the surroundings thereof. The first SiOC film 151 and the second SiOC film 153 may be films that have no distributions in compositions and density strength in the film.

A method for manufacturing the semiconductor device of the present embodiment is described hereinafter. In the manufacturing process of the semiconductor device 150 and semiconductor device 160, the manufacturing process of the semiconductor device 100 and the semiconductor device 110 may be used, respectively. Instead of a process in which the first porous MSQ film 105 and the second porous MSQ film 121 are provided, the first SiOC film 151 and the second SiOC film 153 are provided, respectively. The process for providing the first SiOC film 151 and the second SiOC film 153 include a process for providing the air-gap 155 and the air-gap 157, respectively.

A method for manufacturing the semiconductor device 150 uses aforementioned process with reference to FIGS. 1A to 5A, specifically, the first SiCN film 103, the first interconnect 108 and the first plug 114 are exposed on the multilayer film 101.

The first SiOC film 151, which is a low dielectric constant film, is deposited on the first SiCN film 103, and filled between the first interconnects 108 to form the air-gap 155. At this time, the height from the top surface of the first SiCN film 103 to the top surface of the Cu silicide layer 117 should be larger than the width of the first interconnect 108. This allows larger aspect ratio of a concave in which the first SiOC film 151 is buried, and also ensures the air-gap 155 to be provided. The first SiOC film 151 is deposited by a CVD method and the condition for deposition is set for example at not lower than 350 degrees C. and not higher than 400 degrees C., and not less than 5 Torr and not more than 8 Torr. Thus, the air-gap 155 is formed in the first SiOC film 151.

Subsequently, the Cu silicide layer 117 is used as a CMP mask and the CMP process is performed for the first SiOC film 151, and thereby planarizing the surface of the first SiOC film 151 (FIG. 8A). From the formation process of the second SiCN film 119 (FIG. 9A), above procedures are repeated to expose the second SiCN film 119, the second interconnect 124 and the second plug 130 on the first SiOC film 151. The second SiOC film 153 is buried between the second Cu interconnects 125 and between the second plugs 130, and at the same time, the air-gap 157 is provided in the second SiOC film 153. The forming method of the second SiOC film 153 may be identical to the forming method of the first SiOC film 151. Planarization of the second SiOC film 153 is performed to form a multilayer interconnect structure shown in FIG. 11A, so as to produce the semiconductor device 150.

The semiconductor device 160 shown in FIG. 11B is basically manufactured in a similar manner as in the semiconductor device 150, however, as shown in FIG. 1B, the occurrence of the misalignment during formation process of the via hole on the first Cu interconnect 109 causes the first Cu via 116 to be buried in the via hole 148 with misalignment 137, instead of the first Cu via 115. The second Cu via 132 with misalignment 139 is also formed on the upper portion of the second Cu interconnect 125 instead of the second Cu via 131.

Effects of the present embodiment are described hereinafter.

Also in the present embodiment, the first SiOC film 151 is provided contiguously and integrally from the side surface of the first interconnect 108 through the side surface of the first plug 114. The first SiOC film 151 is formed after the first interconnect 108 and the first plug 114 are formed. The layer of second SiOC film 153 is configured similarly as above. The cap metals are provided at the upper portions of the interconnect and the plug. In addition, the lower side surfaces of the first interconnect 108 and the second interconnect 124 are, respectively, supported by the first SiCN film 103 and the second SiCN film 119. Such configuration gives similar effects as in the first embodiment.

The first SiOC film 151 and the second SiOC film 153 that function as an insulating interlayer are respectively configured to have air-gap 155 and air-gap 157, so that the interconnect capacitance among first interconnects 108 and among the second interconnects 124 can favorably be reduced. Therefore in this embodiment, the relative dielectric constant required for the insulating interlayer is not as high as the case in the first embodiment. Such films may have lower degree of porosity with increased density, and thereby achieving greater strength of the insulating interlayer. This may further eliminate a strengthening process such as electron beam irradiation or ultraviolet light irradiation and thus simplify the manufacturing process.

In the present embodiment is described a configuration in which the insulating interlayer having an air-gap 155 and air-gap 157 is the first SiOC film 151 and the insulating interlayer having air-gap 157 is the second SiOC film 153. Such insulating film, however, may be other materials illustrated in the first embodiment, or $SiO_2$ film may be used instead of low dielectric constant film.

In addition, in the present embodiment, the relative dielectric constant of the insulating interlayer may, for example, not more than 3.5, preferably not more than 3.2 in order to desirably reduce the interconnect capacitances among the first interconnect 108 and among the second interconnects 124. Or relative dielectric constant of the insulating interlayer may, for example, not less than 2.0, preferably not less than 2.5 in order to further strengthen the insulating interlayer and further improve the thermal cycle properties.

Third Embodiment

The above embodiments describes a configuration in which the Cu silicide layer that functions as a cap metal film is provided on a via plug, however, the cap metal film may not be provided on the via plug. There will be, as an example, described the configuration of the first embodiment, but the configuration of this embodiment may be applied to that in the second embodiment.

Figure 12A:
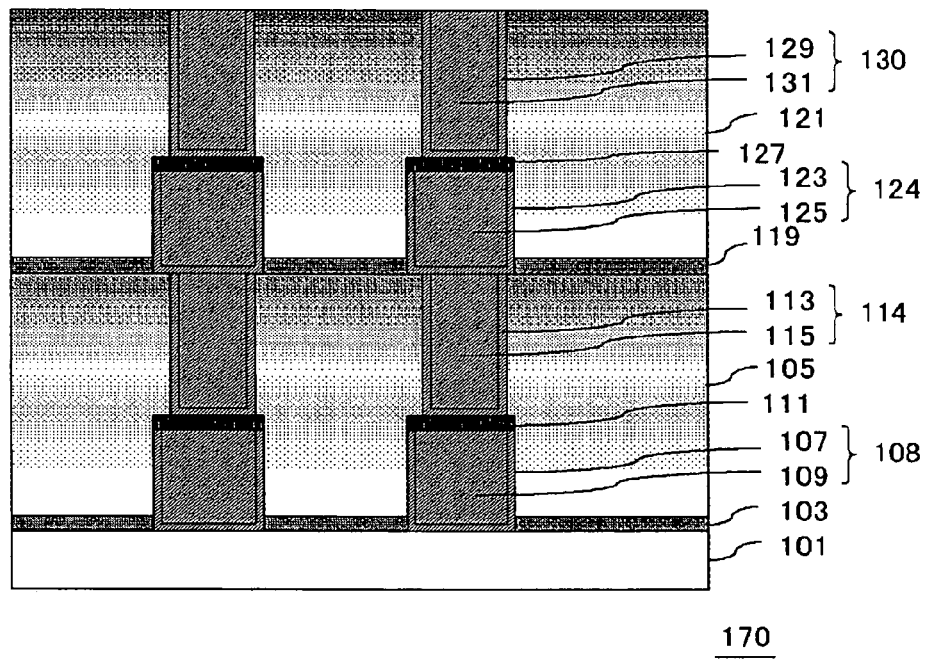
FIGS. 12A and 12B are cross sectional views showing the configuration of semiconductor device according to an embodiment.
Figure 12B:
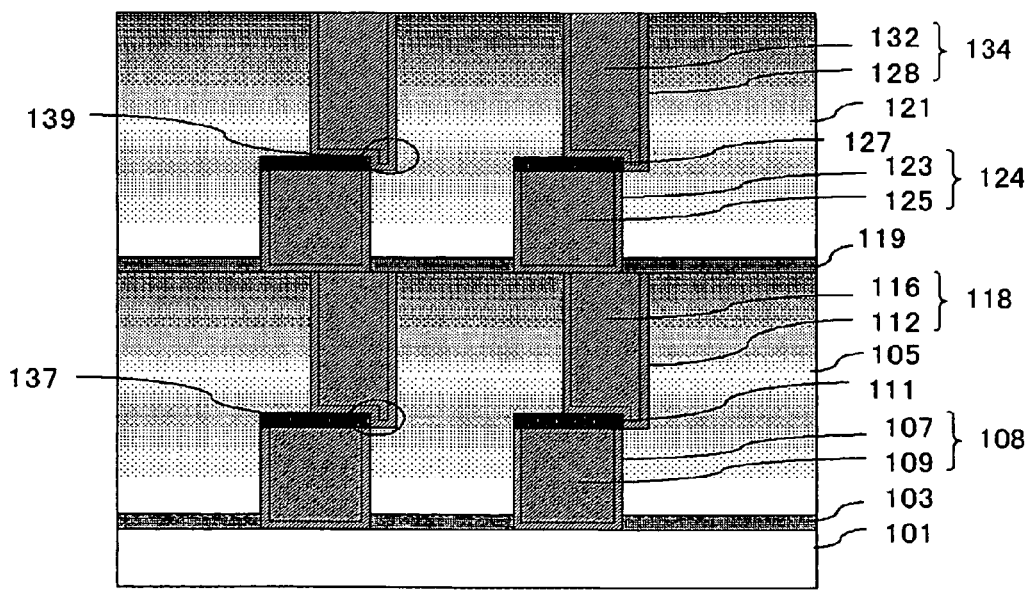

FIGS. 12A and 12B are cross sectional views showing semiconductor devices of the present embodiment. The semiconductor device 172 in FIG. 12B shows a configuration in which misalignment occurs at a junction of the interconnect and the via in the semiconductor device 170 shown in FIG. 12A.

In basic configurations, the semiconductor device in FIGS. 12A and 12B are respectively as similar as semiconductor device in FIGS. 10A and 10B, except that no Cu silicide layer provided at the upper portion of the first plug 114, the first plug 118, the second plug 130, and the second plug 134. Instead, the first plug 114 and the first plug 118 are provided in contact with the second SiCN film 119 and the upper portion of the first porous MSQ film 105 is covered with the second SiCN film 119.

A method for manufacturing a semiconductor device 170 and a semiconductor device 172 is now described hereinafter. The manufacturing method of the present embodiment includes processes of forming an insulating film (the first porous MSQ film 105); planarizing the first porous MSQ film 105 using mechanical-chemical polishing; and removing the first porous MSQ film 105 and the second metal cap metal film (the Cu silicide layer 117) on the via (first plug 114).

More specifically, a method for manufacturing each of the semiconductor device 170 and the semiconductor device 172, may use the method for manufacturing each of the semiconductor device 100 and the semiconductor device 110 described in the first embodiment, respectively. The CMP process is performed on the first porous MSQ film 105 by using Cu silicide layer 117 as a CMP mask in order to planarize the surface of the first porous MSQ film 105 (FIG. 8A) and then Cu silicide layer 117 is removed through a CMP method. The second porous MSQ film 121 is also planarized and then Cu silicide layer 133 is removed through a CMP method. These Cu silicide layers are removed by, for example, using the Cu silicide layer 117 as a mask, grinding to remove the first porous MSQ film 105 which is stacked on the Cu silicide layer 117, and then grinding Cu silicide layer by selecting slurry that grind the Cu silicide layer and does not grind Cu film.

In the manufacturing process of the semiconductor device 172 shown in FIG. 12B that is basically as similar as the manufacturing process of semiconductor device 170, misalignment occurs when via hole is formed on the upper portion of the first Cu interconnect 109, and instead of the first Cu via 115, the first Cu via 116 is buried in the via hole 148 with misalignment 137. Also, instead of the second Cu via 131, the second Cu via 132 with misalignment 139 is formed on the upper portion of the second Cu interconnect 125.

According to the present embodiment, no cap metal is provided on the first plug 114 and the second plug 130. This configuration can effectively reduce the contact resistance between the plug and interconnect thereabove. In the present embodiment, the upper portion of the first porous MSQ film 105 which is provided with the first plugs 114 and 118 is coated with the second SiC film 119, so that a diffusion of Cu into the insulating interlayer can be reduced.

There has been described this invention with reference to some embodiments. It will be apparent to those skilled in the art that these embodiments are merely illustrative, many variations may be possible and such variations are encompassed by the present invention.

In the above embodiments, for example, the density of insulating film may be determined by observing the cross section of the semiconductor device through the TEM (transmission electron microscope).

In the present embodiment, a double layered interconnect structure has been described in which plug is provided on the interconnect layer, however, the number of layers stacked are not limited in particular. Even in the case in which three or more layers are stacked, the configuration of the present embodiment may be applied so as to effectively reduce the interconnect capacitance and achieve a stable production.

Although there has been described the case where a Cu silicide layer is selectively grown as a cap metal film by CVD in this embodiment, a Cu silicide nitride layer may be selectively grown. Alternatively, a cap metal film may be formed by selective plating of a CoWP or CoWB film, or a W film may be selectively grown by CVD.

Example

In this example, variation in film quality by post-treatment after deposition was investigated for a porous SiOC as a material for low dielectric constant insulating interlayer.

A porous SiOC film with a thickness of about 200 nm was formed and irradiated with EB (Electron Beam), and film quality was improved. For example, EB irradiation at 0.2 mC/cm$^2$ and 350 degree C. under an atmosphere with an oxygen concentration of 100 ppm or less gave, at a dielectric constant of 2.35, a mechanical strength (Modulus) of up to 7 GPa, indicating improvement by about two folds or more in comparison with that before the EB treatment.

TEM (transmission electron microscopy) for the cross section of the porous SiOC film before and after the treatment of EB irradiation indicated that the EB irradiated side had a higher density than the opposite side. The film had a higher density as a distance from the rear face of the EB irradiated side is increased, and there were no regions where a density discontinuously varied.

Figure 13:
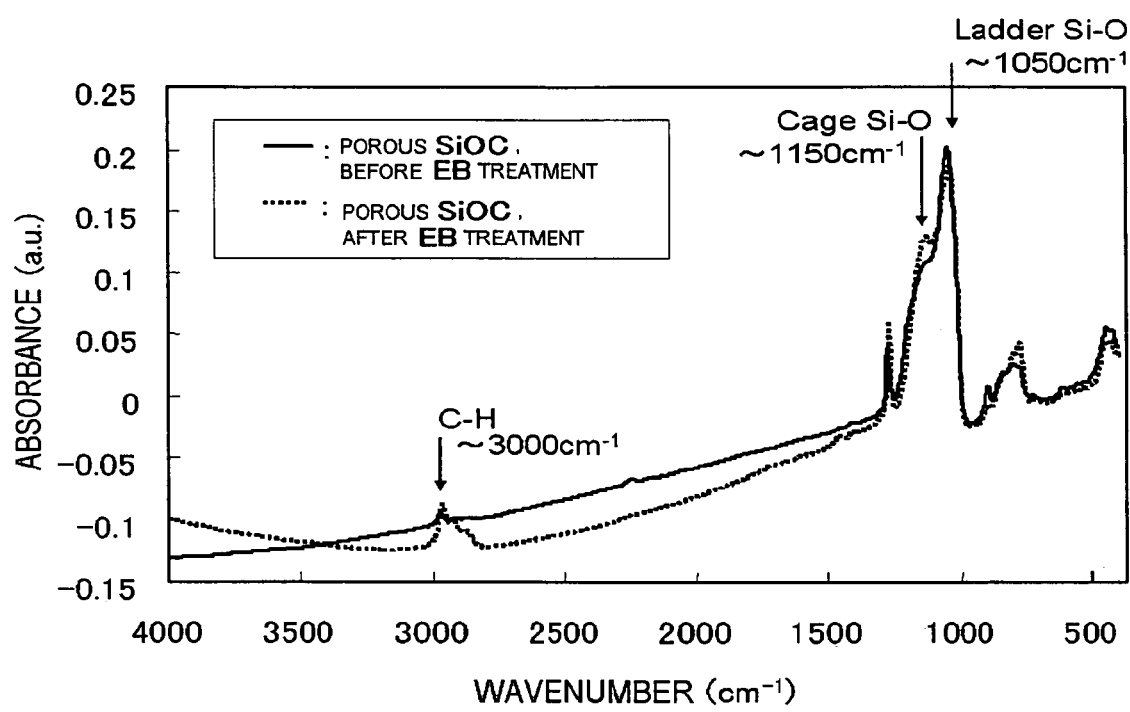
FIG. 13 is a graph showing an FTIR spectrum of a porous SiOC film in an example.

Film quality was then evaluated by FTIR spectrometry (Furier Transmittance Infra Red Spectrometry). FIG. 13 is an FTIR spectrum of the porous SiOC film. FIG. 13 gave an absorption spectrum of a bond having a peak at about 1150 cm$^{-1}$ (1100 to 1200 cm$^{-1}$) probably indicating a Cage type Si—O structure, and of a bond having a peak at about 1050 cm$^{-1}$ (1000 to 1100 cm$^{-1}$) probably indicating a Ladder type Si—O structure, before EB irradiation. In contrast, after the EB treatment described above, a peak intensity around 1150 cm$^{-1}$ reflecting a Cage type Si—O structure was reduced while a peak intensity around 1050 cm$^{-1}$ reflecting a Ladder type Si—O structure was increased. Thus, EB irradiation could change the Si—O bond state.

The film was treated as described above, for a porous SiOC film with a larger thickness. Then, a distribution in the film structure was generated in the depth direction. Specifically, the surface part was richer in the Ladder type Si—O structure than the deeper part while the deeper part was richer in the Cage type Si—O structure than the shallower part.

The EB irradiation reduced a peak intensity of an absorption band of a bond having a peak around 3000 cm$^{-1}$ derived from C—H bond. It may indicate that a carbon concentration in the EB irradiated side became lower than the opposite side.

By further increasing an EB dose, mechanical strength could be further improved. It was observed that in the film after the EB irradiation, Si—O bonds were increased while C—H bonds were reduced in the EB irradiated side, in comparison with that before.

A similar tendency was observed when using a UV (ultraviolet)-ray lamp instead of EB.

A similar EB irradiation effect was observed when using hydrogenated polysiloxane in place of SiOC as a low dielectric-constant material.

It is apparent that the present invention is not limited to the above embodiment, which may be modified and changed without departing from the scope and spirit of the invention.

What is claimed is:

1. A semiconductor device, comprising:
   an interconnect layer including a plurality of interconnects;
   a first cap metal film provided to contact an upper portion of said interconnect and covering the upper portion of said interconnect;
   a conductive via provided on an upper portion of said first cap metal film and connected to said interconnect;
   a contiguously integrated insulating film provided from a side wall of said interconnect to a side wall of said via and formed so as to cover the side wall of said interconnect, the upper portion of said interconnect, and the side wall of said via, and an upper portion of said insulating film is denser than a lower portion of said insulating film; and
   a reinforcing insulating film disposed under said insulating film and contact with a lower portion of the side wall of said interconnect,
   wherein a thickness of said reinforcing insulating film is substantially uniform and said reinforcing insulating film has greater film density than said insulating film.

2. The semiconductor device according to claim 1, wherein said interconnect structure is disposed to contact an upper portion of said via and further comprises a second cap metal film covering the upper portion of said via.

3. The semiconductor device according to claim 1, wherein said insulating film is configured of a low dielectric constant material.

4. The semiconductor device according to claim 3, wherein said insulating film is a film irradiated by electron beam or by ultraviolet light.

5. The semiconductor device according to claim 4, wherein said insulating film is selected from the group consisting of a polyorganosiloxane film, a siloxane hydride film, or a porous film of said polyorganosiloxane film or said siloxane hydride film, and said reinforcing insulating film is selected from the group consisting of an SiC film, an SiCN film, or an SiON film.

6. The semiconductor device according to claim 5, wherein in an infrared absorption spectrum of said low dielectric constant material, a peak intensity $I_1$ in an infrared absorption band with its peak at 1150 $cm^{-1}$ is smaller in the upper portion of said insulating film than in the lower portion of said insulating film.

7. The semiconductor device according to claim 5, wherein in an infrared absorption spectrum of said low dielectric constant material, a peak intensity $I_2$ in an infrared absorption band with its peak at 1050 $cm^{-1}$ is larger in the upper portion of said insulating film than in the lower portion of said insulating film.

8. The semiconductor device according to claim 5, wherein in an infrared absorption spectrum of said low dielectric constant material, a peak intensity $I_3$ in an infrared absorption band with its peak at 3000 $cm^{-1}$ is smaller in the upper portion of said insulating film than in the lower portion of said insulating film.

9. The semiconductor device according to claim 1, wherein said insulating film is configured of a low dielectric constant material and an upper portion of said insulating film has greater mechanical strength than a lower portion thereof.

10. The semiconductor device according to claim 1, wherein said insulating film is configured of a low dielectric constant material containing carbon as a constituent element and the carbon concentration of an upper portion of said insulating film is lower than a lower portion of said insulating film.

11. The semiconductor device according to claim 1, wherein said insulating film is provided with an air-gap in said insulating film.

12. The semiconductor device according to claim 11, wherein said air-gap is provided between said interconnect layer and a via layer including a plurality of said conductive vias in said insulating film.

13. The semiconductor device according to claim 1, further comprising:
a second interconnect made of a copper-containing metal and provided on an upper portion of said via to be connected to said via; and
a second reinforcing insulating film disposed as an upper layer of said insulating film so as to contact a lower portion of a sidewall of said second interconnect with greater film density than said insulating film.

14. The semiconductor device according to claim 1, wherein a plurality of said interconnect structures are layered, and
said via in one said interconnect structure is connected to said first interconnect in another interconnect structure provided at the upper portion of said one interconnect structure.

15. The semiconductor device according to claim 1, wherein the reinforcing insulating film has a substantially same thickness in a plurality of regions between interconnects.

16. The semiconductor device according to claim 1, wherein the interconnect is made from a copper-containing metal.

17. The semiconductor device according to claim 1, wherein the insulating film has a mechanical strength that is two or more times greater in the upper portion than in the lower portion.

18. The semiconductor device according to claim 1, wherein at a discontinuity surface of the semiconductor device in which a data ratio changes discontinuously, no discontinuity surface is configured to give discontinuous change to a composition and properties of the insulating film.

19. The semiconductor device according to claim 18, wherein when a low data ratio region is provided on a high data ratio region, no surface that is discontinuous in the compositions or properties of the insulating film exists at a level on which a bottom surface of the low data ratio region lies.

20. A semiconductor device, comprising:
an first interconnect layer including a plurality of interconnects;
a first cap metal film provided to contact an upper portion of said interconnect and covering the upper portion of said interconnect;
a conductive via provided on an upper portion of said first cap metal film and connected to said interconnect;
a first contiguously integrated insulating film provided from a side wall of said interconnect to a side wall of said conductive via and formed so as to cover the side wall of said interconnect, the upper portion of said interconnect, and the side wall of said conductive via, and an upper portion of said first contiguously integrated insulating film is denser than a lower portion of said first contiguously integrated insulating film;
a first reinforcing insulating film disposed under said first contiguously integrated insulating film and contact with a lower portion of the side wall of said interconnect, a thickness of said first reinforcing insulating film being substantially uniform and said first reinforcing insulating film having greater film density than said first contiguously integrated insulating film,
a second interconnect layer made of a copper-containing metal and provided on an upper portion of said conductive via to be connected to said conductive via; and
a second reinforcing insulating film disposed as an upper layer of said first contiguously integrated insulating film so as to contact a lower portion of a sidewall of said second interconnect with greater film density than said first contiguously integrated insulating film, a thickness of said second reinforcing insulating film being substantially uniform and said second reinforcing insulating film having greater film density than said first contiguously integrated insulating film.

21. The semiconductor device according to claim 20, wherein at a discontinuity surface of the semiconductor device in which a data ratio changes discontinuously, no discontinuity surface is configured to give discontinuous change to the composition and properties of the insulating films, and when a low data ratio region is provided on a high data ratio region, no surface that is discontinuous in the compositions or properties of the insulating films exists at a level on which a bottom surface of the low data ratio region lies.

* * * * *